United States Patent
Yamaguchi et al.

(10) Patent No.: US 9,162,252 B2
(45) Date of Patent: Oct. 20, 2015

(54) FILM FORMING METHOD

(71) Applicant: TOKYO ELECTRON LIMITED, Tokyo (JP)

(72) Inventors: Tatsuya Yamaguchi, Nirasaki (JP); Reiji Niino, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 66 days.

(21) Appl. No.: 13/901,909

(22) Filed: May 24, 2013

(65) Prior Publication Data
US 2013/0316080 A1  Nov. 28, 2013

(30) Foreign Application Priority Data
May 28, 2012 (JP) ................... 2012-121047

(51) Int. Cl.
*C23C 16/00* (2006.01)
*B05D 1/00* (2006.01)

(52) U.S. Cl.
CPC ........................ *B05D 1/60* (2013.01)

(58) Field of Classification Search
CPC .. B05D 1/60; C23C 16/455; C23C 16/45525; C23C 16/45527
USPC .......................... 427/255.6, 248.1
See application file for complete search history.

(56) References Cited

U.S. PATENT DOCUMENTS

| | | | |
|---|---|---|---|
| 5,536,792 A * | 7/1996 | Hogan et al. ............ | 525/432 |
| 2006/0199920 A1 | 9/2006 | Okada et al. | |
| 2009/0238968 A1* | 9/2009 | Hatanaka et al. ........ | 427/237 |
| 2011/0091650 A1 | 4/2011 | Noguchi et al. | |

FOREIGN PATENT DOCUMENTS

| JP | 5-265006 A | 10/1993 |
|---|---|---|
| JP | H08-176803 A | 7/1996 |
| JP | 2011-187583 A | 9/2011 |

OTHER PUBLICATIONS

Putkonen et al. Atomic layer deposition of polyimide thin films, J. Mater. Chem. 2007, 17, pp. 664-669.*

* cited by examiner

*Primary Examiner* — Kelly M Gambetta
(74) *Attorney, Agent, or Firm* — Nath, Goldberg & Meyer; Jerald L. Meyer

(57) ABSTRACT

According to an embodiment of the present disclosure, a method of forming a polyimide film on a substrate is disclosed. Such method can be easily controlled and form a polyimide film applicable as an insulation film. While a wafer is heated at a temperature at which a polyimide film is formed, a cycle, in which the wafer is sequentially supplied with a first processing gas, for example, containing a PMDA-based first monomer, and a second processing gas containing a non-aromatic monomer, for example, an HMDA-based second monomer, is performed for a predetermined number of times. When the processing gases are switched, a replacement gas is supplied into a reaction tube so that the monomers are not mixed together under the atmosphere in the reaction tube.

4 Claims, 23 Drawing Sheets

Electron Density :          Low          High

First Monomer          Second Monomer

Reactivity : Low

Electron Density :          High ⟵ Low

First Monomer          Second Monomer

Reactivity : High

Second Monomer

| Abbreviation (Name) | Structural Formula |
|---|---|
| H12MDA |  |
| H12MDAMe |  |
| H6XDA |  |
| HMDA<br>($C_6H_{12}N_2$: hexamethylenediamine) |  |
| DAD |  |

FIG. 20

Second Monomer

| Abbreviation (Name) | Structural Formula |
|---|---|
| 4-4'-ODA ($C_{12}H_{12}N_2O$ : 4-4'-diaminodiphenyl ether) | $2HN$—⌬—O—⌬—$NH_2$ |
| 3-4'-ODA ($C_{12}H_{12}N_2O$ : 3-4'-diaminodiphenyl ether) | $2HN$—⌬—O—⌬($NH_2$) |
| NDA | $2HN$—naphthalene—$NH_2$ |
| DDS | $2HN$—⌬—$SO_2$—⌬—$NH_2$ |

FILM FORMING METHOD

CROSS-REFERENCE TO RELATED APPLICATION

This application claims the benefit of Japanese Patent Application No. 2012-121047, filed on May 28, 2012, in the Japan Patent Office, the disclosure of which is incorporated herein in its entirety by reference.

TECHNICAL FIELD

The present disclosure relates to a method of forming a polyimide film on a substrate.

BACKGROUND

A polyimide film is known as one of organic-based thin films used to manufacture a semiconductor device. The polyimide film is formed, for example, by dehydration condensation of two kinds of monomers. Specifically, as illustrated later in FIG. 2, a bifunctional acid anhydride, e.g., PMDA ($C_{10}H_2O_6$: pyromellitic dianhydride), and a bifunctional amine, e.g., HMDA ($C_6H_{16}N_2$: hexamethylenediamine) are used as the monomers. A polyimide film is formed by mixing the monomers in a solution to produce a polyamide acid solution that is a precursor solution and then by applying the precursor solution to a substrate such as a semiconductor wafer (hereinafter, referred to as a "wafer") and simultaneously heating the wafer.

However, increasingly, the semiconductor devices are demanded to be miniaturized for electronic devices such as a cellular phone and the like. As such, the configuration has been suggested to stack a plurality of wafers each having such semiconductor devices formed thereon, and simultaneously, electrode portions of the respective devices are vertically connected to each other. The inventors have considered the following aspect in forming such three-dimensional configuration.

That is, for example, a hole-shaped concave portion is formed in such a manner that a device is formed on a surface of a wafer and dry etching is performed from the back side of the wafer so that an electrode portion on the underside of the device is exposed. Then, a conducting portion such as copper is buried in the concave portion. Simultaneously, disposing another wafer having a device formed thereon on the back side of the wafer, so that both the devices are electrically connected to each other through the conducting portion (specifically, including a bump and the like disposed between the wafers). Accordingly, a plurality of wafers is sequentially stacked, thereby forming the integration structure of devices. Practically, although a process of forming the concave portion or a process of burying the conducting portion is performed while turning the wafer over, the surface of the wafer is here described as a side having the device formed thereon for convenience of illustration.

The aforementioned concave portion is formed to have a depth (e.g., 50 micrometers) until the device is reached from the back side of the wafer. Meanwhile, the concave portion is formed to have an opening dimension (diameter), e.g., a small diameter of 5 micrometers, so as not to interfere with a conducting portion of another integrated structure adjacent to the concave portion, i.e., so as to highly density the integrated structure as much as possible. Therefore, the concave portion has an extremely large aspect ratio (i.e., the ratio of the diameter to the depth of the opening).

In this case, since the wafer is made of silicon (Si), an insulation film is necessarily formed along an inner wall of the concave portion before the conducting portion is buried therein so that the wafer and the conducting portion are not electrically connected to each other through the inner wall of the concave portion (so that the wafer and the conducting portion are insulated from each other). Thus, the inventors attempt to apply the polyimide film as the insulation film. FIG. 13 used in an after-mentioned embodiment shows the configuration described above, wherein reference numeral 1 designates a polyimide film, reference numeral 10 designates a concave portion, reference numeral 11 designates a device, reference numeral 14 designates a temporary fixing material, and reference numeral 15 designates a support substrate.

However, the polyimide film has a relative permittivity, for example, of about 3.5, which is higher than that of other materials, so that it is difficult to use the polyimide film as the insulation film. There is a method of forming an alignment film in such a manner that a precursor is formed by depositing monomers on a substrate heated between 38 degrees C. and 75 degrees C., the deposition of the monomers is stopped, and then, the precursor is imidized by heating the substrate up to 200 degrees C. However, according to the method, the concave portion as described above cannot be satisfactorily buried, and it is necessary to elevate the process temperature of the latter stage in which there is a high difference in temperature during a film forming process.

SUMMARY

The present disclosure is to provide a method of forming a polyimide film on a substrate, which can be easily controlled and form a polyimide film applicable as an insulation film.

According to an aspect of the present disclosure, a method of forming a polyimide film on a surface of a substrate by dehydration condensation of a first monomer including a bifunctional acid anhydride and a second monomer including a bifunctional amine is provided. The method includes loading the substrate into a processing chamber, heating the substrate at a temperature for forming a polyimide film, supplying the substrate with a first processing gas containing the first monomer and a second processing gas containing the second monomer, and evacuating at least one of the first processing gas and the second processing gas from the processing chamber. Further, at least one of the first and second monomers is a non-aromatic monomer.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 20 is an explanatory view showing an example of the second monomer used in the film forming method.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
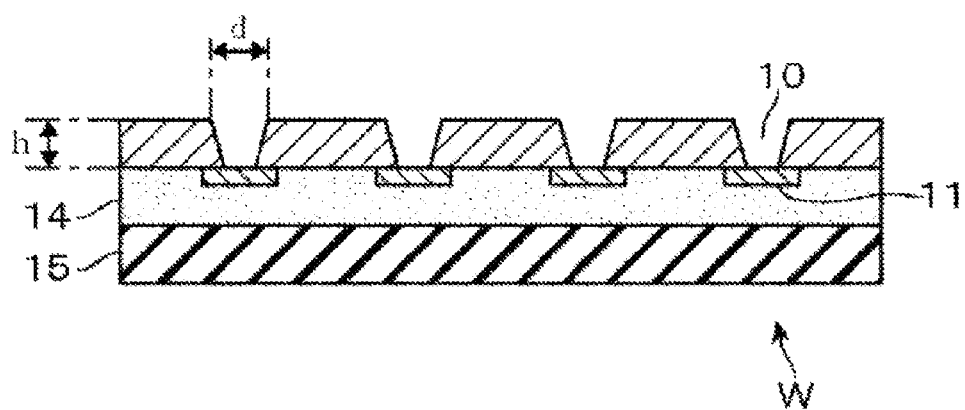
FIG. 1 is a longitudinal sectional view schematically showing an example of a surface structure of a wafer of the present disclosure.

An embodiment according to a film forming method of the present disclosure will be described with reference to FIGS. 1 to 14. FIG. 1 shows a surface structure of a wafer W, which is a substrate to be treated and will be subjected to film forming processing. In this embodiment, reference numeral 10 designates a concave portion in the form of a hole, reference numeral 11 designates a device formed on an underside of the wafer W, reference numeral 14 designates a temporary fixing material, such as a resin or the like, and reference numeral 15 designates a support substrate. The concave portion 10 is formed to have an opening dimension d of 1 micrometer to few tens of micrometers and a depth h of 10 micrometers to few hundreds of micrometers. Therefore, the aspect ratio (h/d) of the concave portion 10 is, for example, about 5 to 20. The aspect ratio of the concave portion 10 is shown small in FIG. 1. In the film forming method of the present disclosure, a polyimide film 1, which will be described later, is formed on a surface structure shown in FIG. 1 and then subjected to predetermined processes, thereby obtaining a structure shown in FIG. 14. FIG. 14 shows a portion of a target semiconductor device, wherein reference numeral W1 designates a wafer other than the wafer W, reference numeral 13 designates a conducting portion, and reference numeral 16 designates a bump. The polyimide film 1 functions as a barrier film for preventing metal components of the conducting portion 13 from being diffused into the wafer W.

Figure 2:
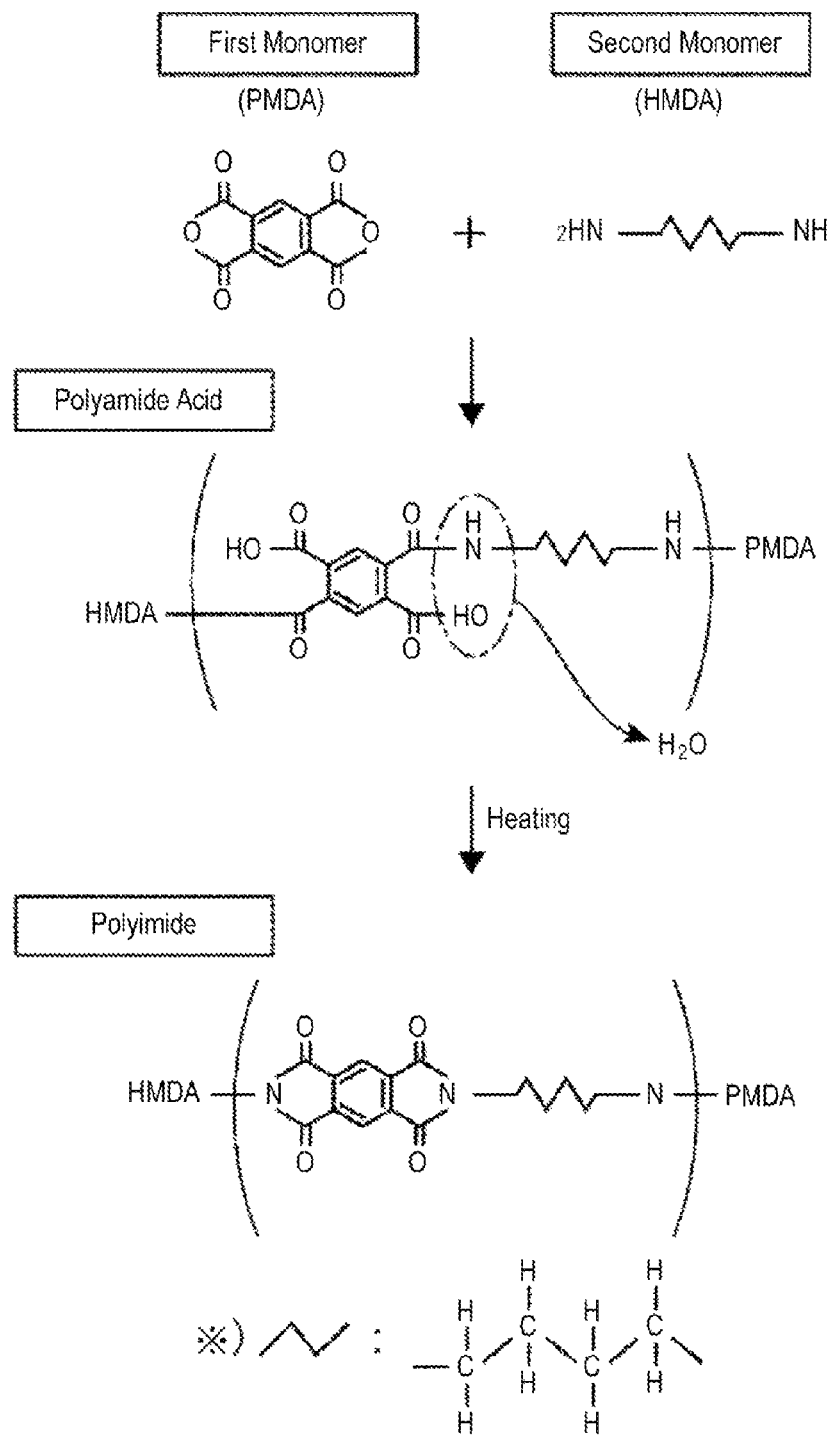
FIG. 2 is a schematic view illustrating a process of forming a polyimide film.

According to an embodiment of the present disclosure, a method of forming the polyimide film 1 on the surface of the structure is shown in FIG. 1. First, a mechanism for synthesizing the polyimide film 1 will be described. As shown in the top of FIG. 2, a first monomer including a bifunctional acid anhydride, e.g., PMDA, and a second monomer including a bifunctional amine, e.g., HMDA ($C_6H_{16}N_2$: hexamethylenediamine), are used in synthesizing the polyimide film 1. Specifically, PMDA has two functional groups, each of which includes a 5-membered ring, in which four carbon elements (C) and one oxygen element (O) are linked to one another in a ring shape by a single bond and other two oxygen elements are linked to the respective carbon elements adjacent to the oxygen element by a double bond. The respective oxygen elements in each 5-membered ring are disposed toward the outside and a benzene sharing two carbon elements in each functional group is interposed between the two functional groups, thereby forming an aromatic monomer. The 5-membered ring is used to form an imide ring.

In HMDA, two amino groups ($-NH_2$), each of which has one nitrogen element (N) and two hydrogen elements (H), are disposed, and the nitrogen elements are respectively bonded to one end and the other end of an alkane, in which a plurality of carbon elements, i.e., six carbon elements in this embodiment, are arranged in a straight chain shape by a single bond. Accordingly, HMDA becomes aliphatic amine that is a non-aromatic monomer. In FIG. 2, carbon and hydrogen elements are omitted.

In addition, if the two kinds of monomers are mixed with each other, a polyamide acid that is a precursor shown in the middle of FIG. 2 is produced. Therefore, the dehydration condensation occurs by means of heat treatment (heating) of the precursor, and a polyimide shown in the bottom of FIG. 2 is synthesized. In the case that the polyimide film 1 is formed in such a manner that the aforementioned precursor is formed, for example, in a solution, the precursor solution is applied to a surface of the wafer W and then a heat treatment is performed, since the precursor is buried in the concave portion 10, the conducting portion 13 cannot be formed in subsequent processes.

On the other hand, in a sequence polymerization method of the present disclosure, the polyimide film 1 having the excellent uniformity in the film thickness (excellent burial characteristics into the concave portion 10) can be formed, as described in detail below. First, the configuration of a vertical type heat treatment apparatus used in the sequence polymerization method will be described with reference to FIGS. 4 and 5.

Figure 3:
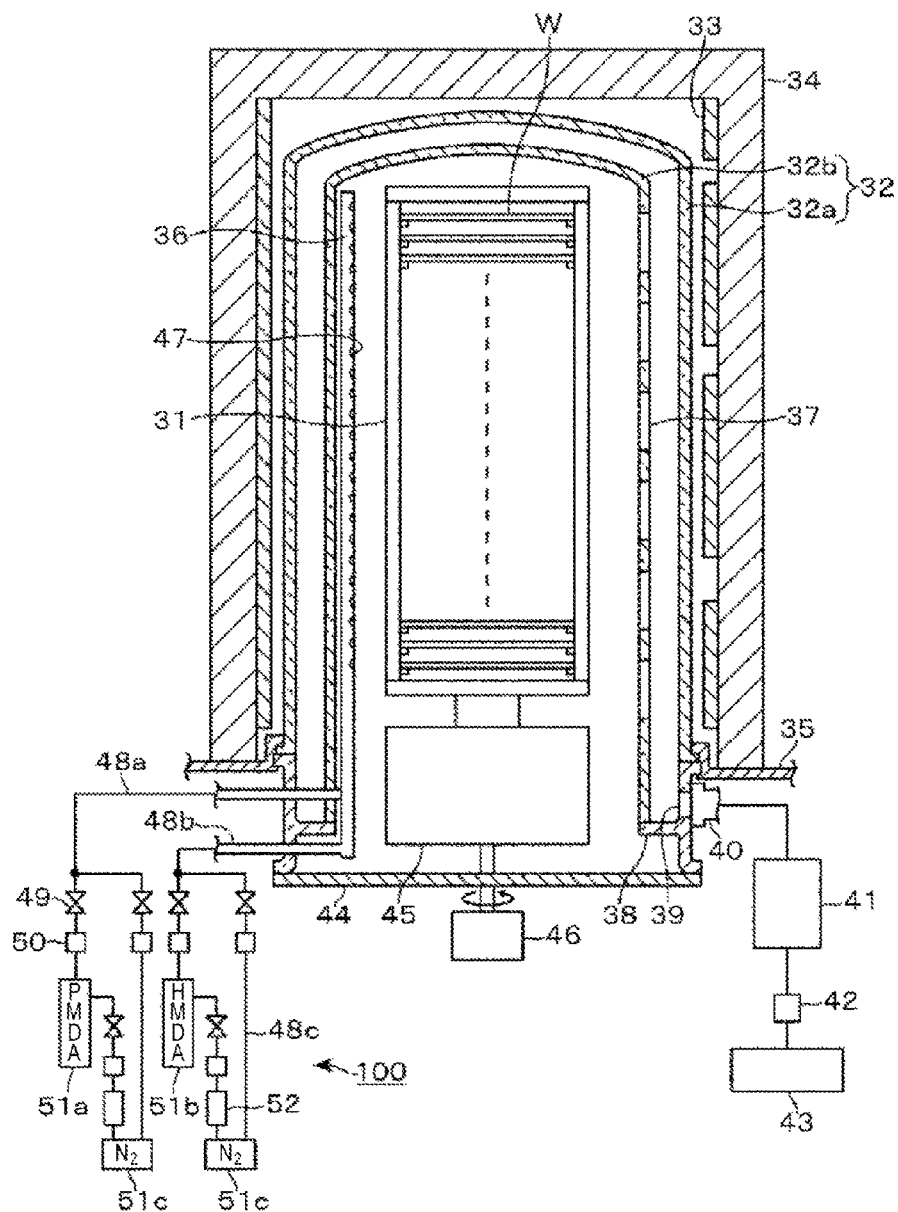
FIG. 3 is a longitudinal sectional view showing an example of an apparatus for performing a film forming method.

The vertical type heat treatment apparatus, as shown in FIG. 3, has a wafer boat 31 for loading wafers W in a shelf form, a reaction tube (processing chamber) 32 for accommodating the wafer boat 31 therein and performing film forming processing on each wafer W. A heating furnace main body 34 having a heater 33 disposed on an inner wall thereof is mounted outside the reaction tube 32. In FIG. 3, reference numeral 35 designates a support portion for supporting the reaction tube 32 and the heating furnace main body 34 from a lower side.

The reaction tube 32, in this example, has a double tube structure of an outer tube 32a and an inner tube 32b accommodated inside the outer tube 32a, and a gas injector 36 formed to extend along the lengthwise direction of the inner tube 32b is accommodated inside the inner tube 32b. A plurality of slit-shaped openings 37 extending in the lengthwise direction of the inner tube 32b are vertically formed in a lateral side of the inner tube 32b so as to face the gas injector 36. In FIG. 3, reference numeral 38 designates a substantially cylindrical flange portion configured to support the outer and inner tubes 32a and 32b from the lower side and to air-tightly seal the ring-shaped region between the lower end surfaces of the outer and inner tubes 32a and 32b.

An exhaust opening 39 is formed in a sidewall of the flange portion 38 so as to communicate with the region between the outer and inner tubes 32a and 32b, and a vacuum pump 43 is connected to an evacuation path 40, which extends from the exhaust opening 39, through a removing device 41, which is a trap for removing solid materials or the like produced in the reaction tube 32, and a pressure control unit 42, such as a butterfly valve. In FIG. 3, reference numerals 44 and 45 respectively designate a cover, which air-tightly seals an opening end of the inner tube 32b, and a heat insulator. In FIG. 3, reference numeral 46 designates a rotating mechanism such as a motor for rotating the wafer boat 31 and heat insulator 45 about the vertical axis.

Figure 4:
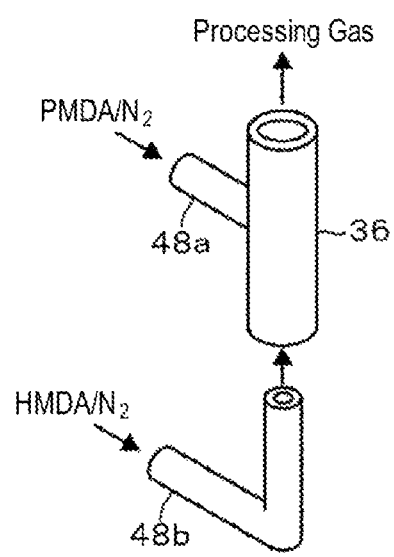
FIG. 4 is an enlarged perspective view showing a portion of a gas injector in the apparatus.

A plurality of gas injection holes 47 are formed along the vertical direction in the sidewall of the gas injector 36 so as to correspond to the levels of the respective wafers W accommodated in the wafer boat 31, i.e., to supply gas to the respective wafers W using a side flow method, which will be described later. Gas supply pipes 48a and 48b for respectively supplying first and second processing gases into the gas injector 36 are air-tightly connected to a lower side of the gas injector 36. Specifically, as shown in FIG. 4, a lower end of the gas injector 36 is open, and one end of the gas supply pipe 48b for supplying the second processing gas is air-tightly inserted into the open end. One end of the gas supply pipe 48a for supplying the first processing gas is connected to a lateral side of the gas injector 36, which is positioned slightly above the open end. Accordingly, these processing gases are independently supplied into the gas injector 36.

The other ends of the gas supply pipes 48a and 48b air-tightly penetrate the sidewall of the flange portion 38 and are respectively connected to gas storage sources 51a and 51b, which respectively store the first and second monomers, through valves 49 and flow rate control units 50. In FIG. 3, reference numeral 51c designates gas storage sources in which for example, nitrogen ($N_2$) gas is stored. The gas storage sources 51c are connected to the gas supply pipes 48a and 48b through gas supply pipes 48c, respectively. Simultaneously, the gas storage sources 51c are respectively connected to the gas storage sources 51a and 51b through the gas supply pipes 48c each having a heater 52 mounted thereto so as to use the nitrogen gas as carrier gas of each monomer. The valves 49, the flow rate control units 50, and the gas storage sources 51a, 51b and 51c constitute a gas supply system 100. Practically, each of the gas storage sources 51a and 51b is configured to gasify (evaporate) a monomer by supplying a heated nitrogen gas into an accommodation container (not shown) in which a solid (particle) or liquid monomer is accommodated, but the term "gas storage source" is used herein.

The vertical type heat treatment apparatus is provided with a control unit (not shown) having a computer for controlling the entire operations of the apparatus, and a memory of the controller stores a program (not shown) for performing the film forming processing by supplying respective processing gases into the reaction tube 32. The program is installed in the controller from a storage unit, i.e., a storage medium, such as a hard disk, a compact disk, a magneto-optical disk, a memory card or a flexible disk.

Hereinafter, the film forming method of the polyimide film 1 will be described together with the operation of the apparatus. First, the reaction tube 32 is air-tightly closed with the cover 44 after loading the wafer boat 31 having a plurality of wafers W accommodated therein into the reaction tube 32 that is heated, for example at 100 degrees C. to 250 degrees C., preferably 150 degrees C. to 200 degrees C. This is the temperature that polyimide film 1 is formed by the heater 33. Then, once the accommodate wafers W is heated to the above temperature, the pressure of the gas in the reaction tube 32 is set, through the pressure control unit 42, to a pressure at which the polyimide film 1 is preferably buried in the concave portion 10, e.g., a vacuum degree of 13 Pa (0.1 torr) to 267 Pa (2.0 torr), preferably 26 Pa (0.2 torr) to 133 Pa (1.0 torr). Simultaneously, the wafer boat 31 is rotated about the vertical axis.

Figure 5:
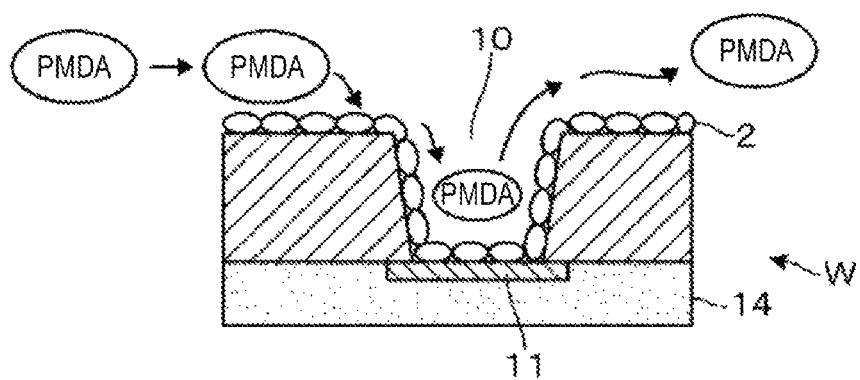
FIG. 5 is a longitudinal sectional view schematically illustrating a portion of the film forming method.

Then, as shown in FIG. 5, each wafer W is supplied with the first processing gas containing the first monomer from the gas injector 36 for a time duration t1 (e.g., 2 seconds), for example, using a side flow method. The first monomer flows from one side toward another side along the surface of the wafer W to be physically adsorbed onto the surface of the wafer W. Then, if the first monomer is adsorbed onto the surface of the wafer W, a portion of the first monomer over the first monomer is hardly or never adsorbed thereto, as can be seen in the following examples. Therefore, an adsorption layer 2 of a single layer (single molecular layer) is uniformly formed on the exposed side (surface) of the wafer W. Thus, a surplus of the first monomer supplied into the reaction tube 32 is discharged from the reaction 32. In this case, since the pressure in the reaction tube 32 is set in the aforementioned range, the adsorption layer 2 having high coatability is formed on an inner wall surface and a bottom surface of the concave portion 10 although the aspect ratio of the concave portion 10 is large.

Figure 6:
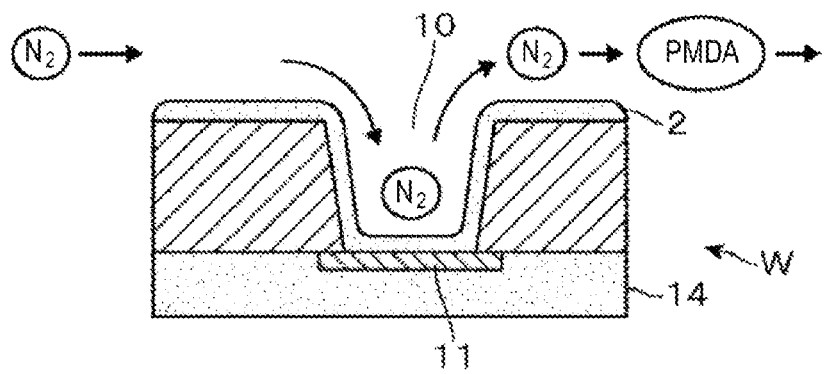
FIG. 6 is a longitudinal sectional view schematically illustrating a portion of the film forming method.

Then, the supply of the first processing gas is stopped, and, an inert gas, e.g., a nitrogen gas or the like is supplied as a purge gas (replacement gas) into the reaction tube 32 for a time duration tp, e.g., 1 second or more (about 1 second to 10 seconds). As shown in FIG. 6, the surplus first monomer remaining in the reaction tube 32 is discharged from the reaction tube 32 by the replacement gas, so that the atmosphere in the reaction tube 32 is replaced by the purge gas.

Figure 7:
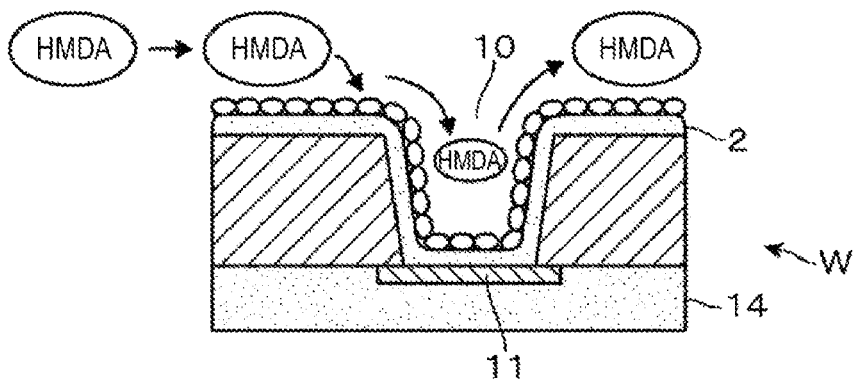
FIG. 7 is a longitudinal sectional view schematically illustrating a portion of the film forming method.

Subsequently, as shown in FIG. 7, the second processing gas containing the second monomer is supplied to the wafer W having the adsorption layer 2 formed thereon for a time duration t2, e.g., about 2 seconds, for example, using the side flow method. In this case, since the atmosphere in the reaction tube 32 has been replaced by the replacement gas, the second monomer is prevented from coming into contact with the first monomer which is spaced apart from the surface of the wafer W in the reaction tube 32 and staying therein.

The second monomer comes into contact with the adsorption layer 2 on the wafer W while flowing from one side toward another side of the wafer W. Since the wafer W is set to the forming temperature of the polyimide film 1, if the adsorption layer 2 and the second monomer come into contact with each other, the aforementioned precursor shown in FIG. 2 are rapidly produced, and simultaneously, the moisture ($H_2O$) immediately escapes from the precursor to allow the dehydration condensation to proceed, thereby forming a reactive layer 3 of polyimide having a plurality of imide molecules polymerized. Accordingly, since the so-called reactive layer 3 is formed from the adsorption layer 2 in such a manner, the reactive layer 3 is formed throughout the exposed surface of the wafer W including the inner wall surface or bottom surface of the concave portion 10.

The reactive layer 3, as shown in the bottom of FIG. 2, has a plurality of the first and second monomers which are alternately arranged to each other, and a benzene ring derived from the first monomer and a straight molecular chain derived from the second monomer are alternately arranged. Thus, since the straight molecular chain is interposed between any two adjacent benzene rings, even though an electron in one benzene ring tries to move toward the other adjacent benzene ring, the movement of the electron is blocked by the straight molecular chain. Accordingly, the reactive layer 3 is controlled to have low relative permittivity, thereby obtaining insulation properties.

In this case, since the reaction between the first and second monomers immediately occurs, the functional group including the 5-membered ring, which reacts with the second monomer, hardly or never remains in the reactive layer 3 formed on the surface of the wafer W. As can be seen in the following examples, the second monomer is not physically adsorbed (has difficulty in being adsorbed) onto the surface of the reactive layer 3. Therefore, since the reactive layer 3 is formed from the first monomer contained in the adsorption layer 2 and the second monomer in an amount capable of reacting with the first monomer, the proportions of the respective monomers is equalized. Accordingly, the reactive layer 3 is formed to have an extremely high polymerization degree. In other words, the functional group including the 5-membered ring contained in the adsorption layer 2 reacts with the second monomer without an excess or deficiency, so that the exposed surface of the wafer W is coated with the reactive layer 3 of a single layer. Similarly, a surplus of the second monomer supplied into the reaction tube 32 is also discharged from the reaction tube 32.

Figure 8:
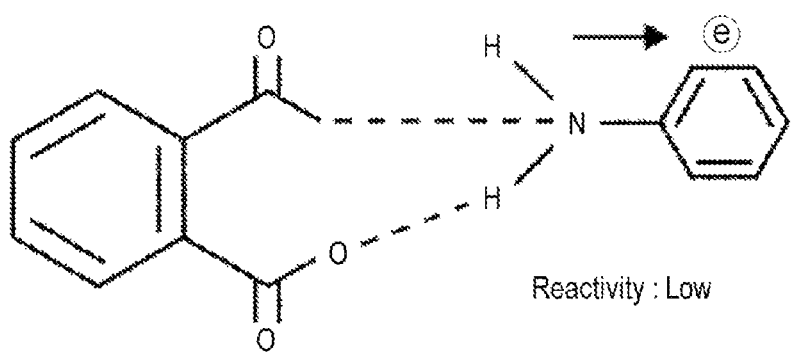
FIG. 8 is a schematic view illustrating a portion of the film forming method.

Here, the reaction mechanism of the polyimide film 1 shown in FIG. 2 will be again described in detail. The second monomer donates electrons to the first monomer. Thus, in a nitrogen element (amino group) as a donor of the electrons, the electrons are easily emitted as the electron density increases. Then, the reaction of the second monomer with the first monomer easily occurs. Thus, as shown in FIG. 8, in the case that an aromatic monomer (in which each amino group is bonded to a benzene ring) is used as the second monomer, since the benzene ring has electron withdrawing properties, in the second monomer, the electron density of the amino group is lower than that of the benzene ring. Therefore, if the aromatic monomer is used as the second monomer, such a fast reaction rate is not obtained (reactivity is lowered). Also, FIG. 8 shows each monomer simplified. In the subsequent FIG. 9, monomers are shown to be simplified.

Figure 9:
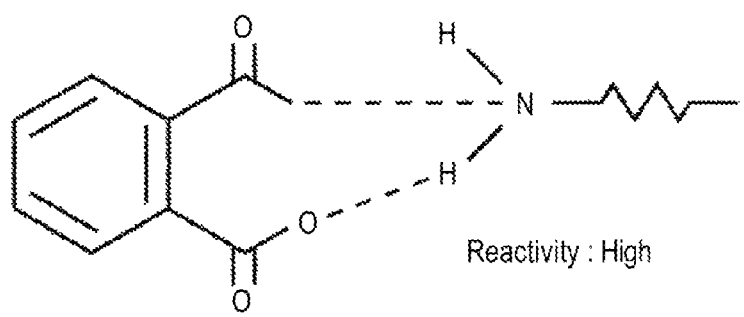
FIG. 9 is a schematic view illustrating a portion of the film forming method.

Meanwhile, as described above, if HMDA that is one of non-aromatic monomers is used as the second monomer, a molecular chain (alkane) between two amino groups in the second monomer has electron donating properties. Hence, as shown in FIG. 9, the electron density of the amino group is higher than that of the molecular chain in the second monomer. Thus, if the non-aromatic monomer is used as the second monomer, the dehydration condensation reaction between the second monomer and the first monomer rapidly proceeds. When a straight carbon chain is interposed between the amino groups, the amino groups easily move, as compared with the case that a benzene ring is interposed between two amino groups, whereby the reactivity of HMDA is increased. However, if the reaction rapidly proceeds like this, it is difficult to control the reaction, for example when the monomers are mixed in a solution and then allowed to react with each other. Accordingly, in the present disclosure, in order to easily control such reaction, as described above, the monomers are alternately supplied to the wafer W, and the atmosphere is replaced when the gases are switched, thereby performing the reaction on the surface of the wafer W.

Figure 10:
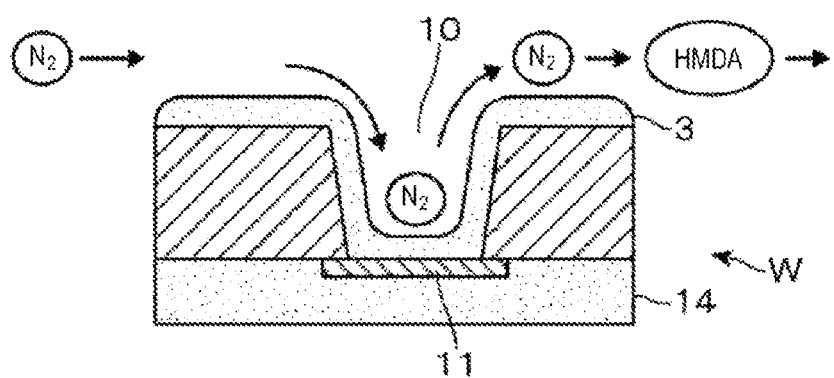
FIG. 10 is a longitudinal sectional view schematically illustrating a portion of the film forming method.

Then, the supply of the second processing gas is stopped, and, a replacement gas is supplied into the reaction tube 32 for a time duration tp. As shown in FIG. 10, the replacement gas causes the second monomer in the reaction tube 32 to be discharged, so that the atmosphere in the reaction tube 32 is replaced by the replacement gas. When the heating temperature of the wafer W when the reactive layer 3 is formed is relatively low, for example, at 150 degrees C. or so, the precursor may remain in a portion of the reactive layer 3 at the time when the supply of the second processing gas is stopped. However, while the replacement gas is supplied into the reaction tube 32 to discharge the second monomer, the reaction of the precursor is performed to finish the production of the polyimide. Thus, the process of supplying the second processing gas and then replacing the atmosphere in the reaction tube 32 may be referred to as a process of discharging the second monomer from the reaction tube 32 and simultaneously finishing the production of the polyimide.

Figure 11:
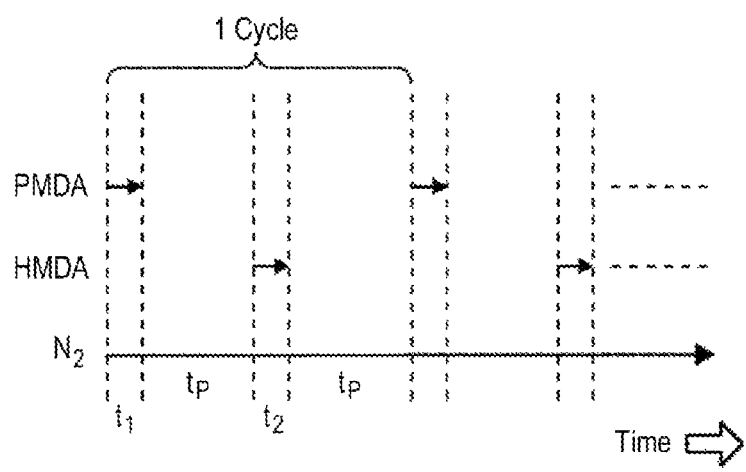
FIG. 11 is a schematic view illustrating the film forming method.
Figure 12:
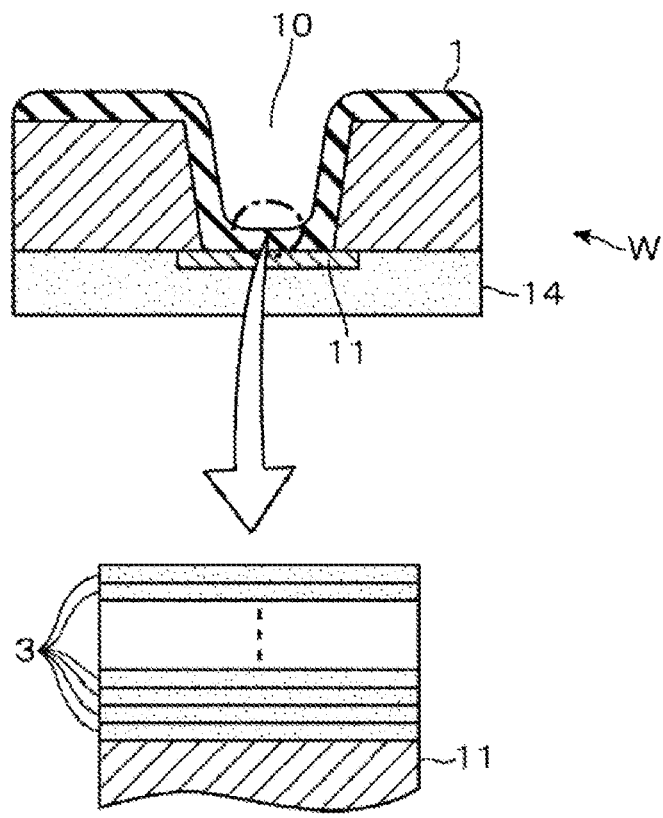
FIG. 12 is a longitudinal sectional view schematically showing the polyimide film.

Accordingly, if the cycle, in which as shown in FIG. 11, the process of supplying the first processing gas and the process of supplying the second processing gas are alternately performed while the process of replacing the atmosphere when switching the processing gases is performed, is repeated a predetermined number of times (i.e., n times: n is an integer of 2 or more), e.g., 100 times or so, a plurality of the reactive layer 3 (the n reactive layers 3) are laminated to thereby form the aforementioned polyimide film 1, as shown in FIG. 12. The thickness of the polyimide film 1 depends on the number of the cycles, and specifically, is about 100 nm to 400 nm. Also, in FIG. 11, since the nitrogen gas is used not only as a replacement gas for replacing the atmosphere but also as a carrier gas for supplying each monomer into the reaction tube 32, the nitrogen gas is supplied from when the formation of the polyimide film 1 is started to when the formation of the polyimide film 1 is finished.

Figure 13:
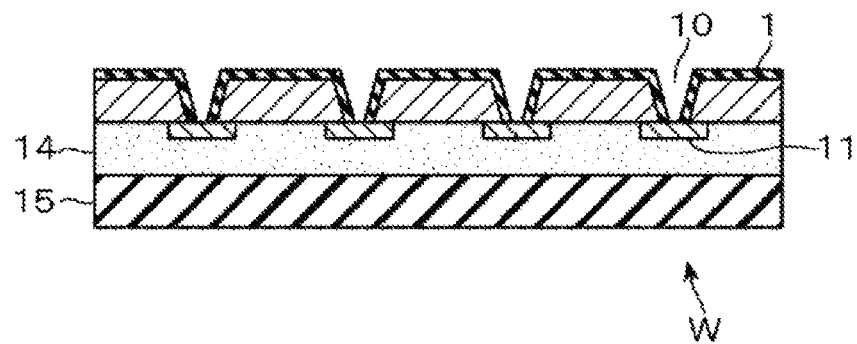
FIG. 13 is a longitudinal sectional view schematically illustrating a portion of the film forming method.
Figure 14:
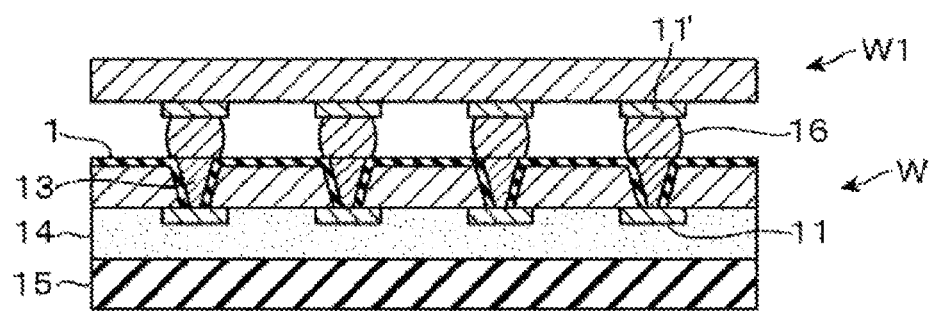
FIG. 14 is a longitudinal sectional view schematically illustrating a portion of the film forming method.

Then, as shown in FIG. 13, the bottom surface (the electrode portion of the device 11) of the concave portion 10 (the electrode portion of the device 11) is exposed by photolithography, and then, the conducting portion 13, for example, of copper or the like, is buried in the concave portion 10 and chemical mechanical polishing (CMP) is performed. Similarly, as shown in FIG. 14, another wafer W1 having a device 11' formed thereon is disposed above the wafer W, and the upper and lower devices 11 and 11' are fixed and electrically connected to each other through the bumps 16, thereby obtaining the structure described above. Then, the temporary fixing material 14 is exfoliated by heating the structure, for example, at about 220 degrees C., so that the support substrate 15 is removed from the structure.

According to the embodiment described above, the polyimide film 1 is formed by the sequence polymerization method. In the sequence polymerization method, the wafer W is heated at a temperature for forming the polyimide film 1, and the cycle in which the wafer W is sequentially supplied with a first processing gas containing a first monomer and a second processing gas containing a second monomer is performed a predetermined number of times, while an atmosphere is replaced when the supplied gases are switched. Here, a non-aromatic monomer is used as the second monomer. Thus, even though an aromatic monomer containing a benzene ring with rich electrons is used as the first monomer, insulative non-aromatic compounds derived from the non-aromatic monomer are arranged at both sides of the benzene ring (aromatic monomer) to interpose the benzene ring between the non-aromatic compounds in the molecular chain constituting the polyimide film 1. Accordingly, since an electron can be restrained from moving through the non-aromatic compound between adjacent benzene rings, the polyimide film 1 having low relative permittivity can be formed, as compared with the polyimide film 1 synthesized using aromatic monomers as the respective monomers. Therefore, the polyimide film 1 can be applied as an insulation film. Further, if a non-aromatic monomer is used as the second monomer, the reaction of the second monomer with the first monomer immediately occurs as described above, thereby rapidly forming the polyimide film 1.

The HMDA used here is a compound with a thermal resistance in addition to insulation properties. Thus, the polyimide film 1 obtained from HMDA also obtains a satisfactory thermal resistance as well as insulation properties. Further, since HMDA that is one of cycloalphatic diamines is a compound used for extremely various purposes, for example, a raw material of nylon, it is possible to restrain an increase in cost when forming the polyimide film 1 having excellent insulation properties. Accordingly, the polyimide film having excellent insulation properties can be inexpensively obtained, for example, as compared with a polyimide film 1 containing fluorine.

Here, since the polyimide film 1 is formed by copolymerization, the reaction does not proceed if both the monomers do not exist. If one of the monomers is supplied, the other monomer on the wafer W is consumed and the film formation is saturated. Accordingly, the film forming amount depends on the number of the supply cycles. Thus, since non-uniformity of the film formation due to the gas flow is reduced and the dependence of the concentration of the monomer on the film forming amount is decreased, the process is easily controlled, and also, the polyimide film 1 having high quality (high polymerization degree and high insulation properties) and uniform film thickness is obtained. Practically, when the polyimide film 1 is formed using the sequence polymerization method of the present disclosure, as compared with the case that the mixture gas is used, it could be seen that the precision in the supply of the monomers can be lowered by about 0 to 30 times and the precision in the heating temperature of the wafer W can be lowered by about 10 times. In addition, although the precision in the supply of the monomer and the precision in the heating temperature of the wafer W are not strictly controlled, the uniformity of the thickness of the polyimide film 1 is improved by about 2% (1 sigma) as compared with the case that the mixture gas is used. Further, when the characteristics of the polyimide film 1 formed by the method of the present disclosure are evaluated, as compared with the case that the aromatic monomer (ODA) is used as the second monomer, the relative permittivity is lowered, and the pyrolysis temperature has the same level (400 degrees C. or more) in terms of thermal resistance.

Further, the different kinds of monomers are not allowed to be mixed with each other under the atmosphere, so that the monomers having different vapor pressures can be polymerized with each other. That is, when the mixture gas in which the monomers are mixed together were to be used to form the polyimide film 1, the vapor pressures of the respective monomers need to be adjusted to certain values, in order to obtain a high polymerization degree for the polyimide film 1. Meanwhile, when the film formation is saturated as described above, the adsorption layer 2 is formed once on the wafer W, and then, the reactive layer 3 is formed after the atmosphere is replaced. Thus, the vapor pressures of the respective monomers do not need to be adjusted, precisely. Accordingly, the polyimide film 1 having a high polymerization degree can be formed regardless of the kinds of monomers used.

Furthermore, since the polyimide film 1 is formed by laminating the reactive layers 3, the polyimide film 1 can be formed at an extremely low film forming temperature of about 150 degrees C. to 200 degrees C. as can be seen in the following examples. Accordingly, the aforementioned polyimide film 1 may be applied as an insulation film used in the process of forming the structure using the temporary fixing material 14 which is exfoliated at a low temperature of 220 degrees C. or so. In other words, according to the method of the present disclosure, the polyimide film 1 can be formed even on an device that cannot endure the film forming temperature (the curing temperature, e.g., 300 degrees C. or so) of the polyimide film when the polyimide film is formed using a conventional method.

In addition, when the reactive layer 3 is formed on the wafer W through the dehydration condensation of the monomers, the silicon layer (the surface of the wafer W) is exposed to the underside of the reactive layer 3 (in the initial stage of the film formation), or another reactive layer 3 is previously formed on the underside of the reactive layer 3 (in the middle stage of the film formation). Thus, the dehydration condensation does not occur at a time in the thickness direction of the polyimide film 1 but occurs in the reactive layer 3 of the outermost surface during the film forming processing, so that it is possible to prevent stress from remaining in the wafer W. Also, in the case that the film forming temperature is low, e.g., 150 degrees C., since the reaction of the reactive layer 3 can be allowed to proceed while the replacement gas is being supplied even though non-reaction precursor remains in the reactive layer 3 formed after the second monomer is supplied, the polyimide film 1 having excellent insulation properties can be formed.

Also, since the gas pressure in the reaction tube 32 is set within the range described above when the film forming process is performed, the polyimide film 1 can be formed along the inner wall of the concave portion 10 although the concave portion 10 having a large aspect ratio has been formed. Accordingly, it is possible to obtain the polyimide film 1 having a satisfactory barrier function.

In addition, it is unnecessary to elevate the temperature of the wafer W, during the process, up to a considerably higher temperature than that in the deposition, as compared with a method of vacuum depositing monomers on a wafer W and then elevating the temperature of the wafer W up to the temperature necessary for imidization. Thus, as described above, the polyimide film 1 can be applied as an insulation film in the process using the temporary fixing material 14, which is exfoliated at a low temperature, and the film forming process can be rapidly performed.

Figure 15:
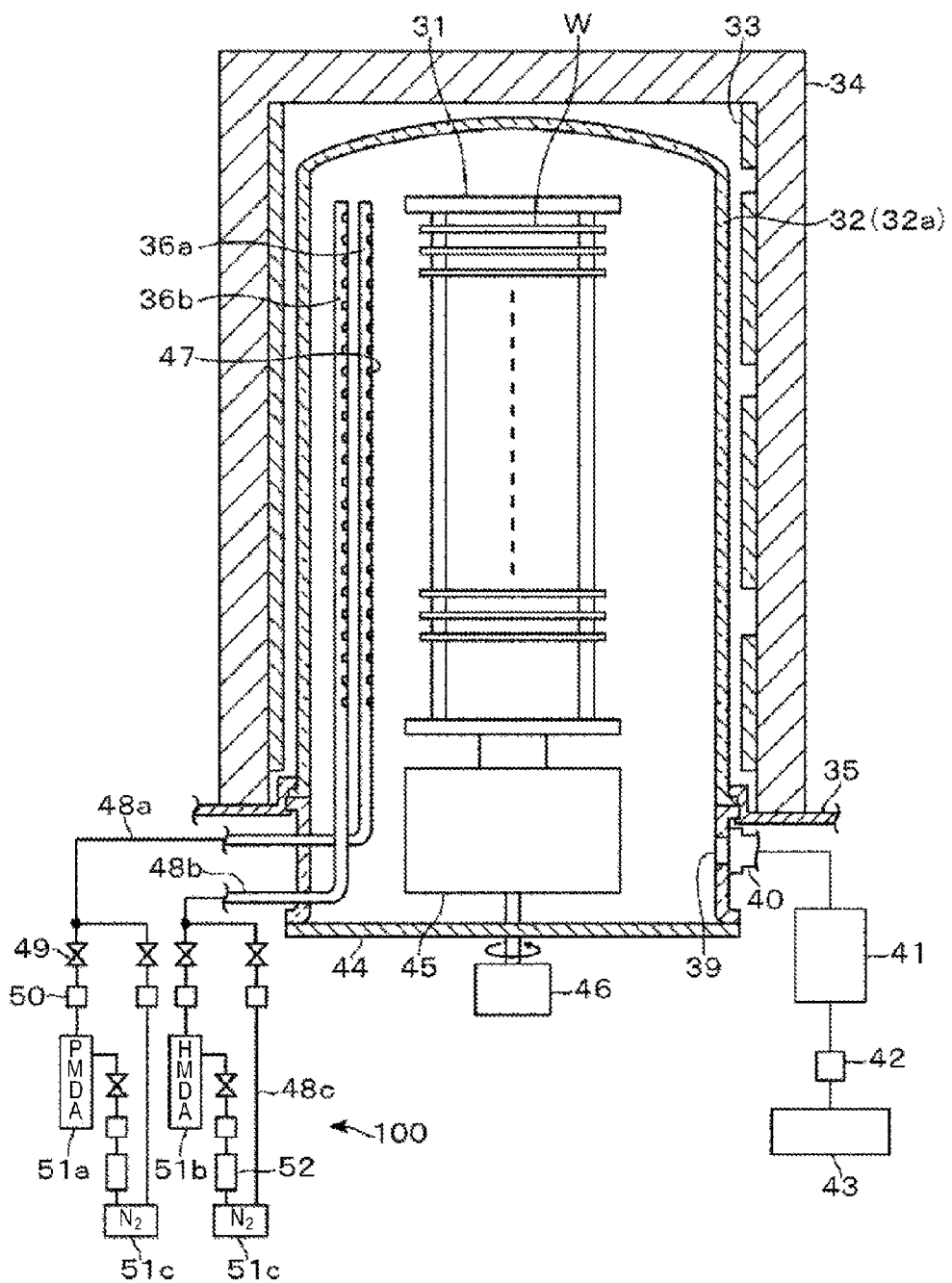
FIG. 15 is a longitudinal sectional plan view showing another example of the apparatus for performing the film forming method.

Instead of the configuration described in FIG. 3, the configuration shown in FIG. 15 may also be used as the vertical type heat treatment apparatus for forming the polyimide film 1. Specifically, the apparatus is provided with the gas injectors 36a and 36b for the respective monomer. A gas injector 36a for a first processing gas (first monomer) and a gas injector 36b for a second processing gas (second monomer) are transversely arranged adjacent to each other along the outer periphery of the wafer boat 31. The layout of the gas injectors 36a and 36b are schematically shown in FIG. 15. Also, in FIG. 15, the same reference numerals designate the same elements as those of the aforementioned vertical type heat treatment apparatus of FIGS. 3 and 4, and redundant descriptions thereof will be omitted.

Figure 16:
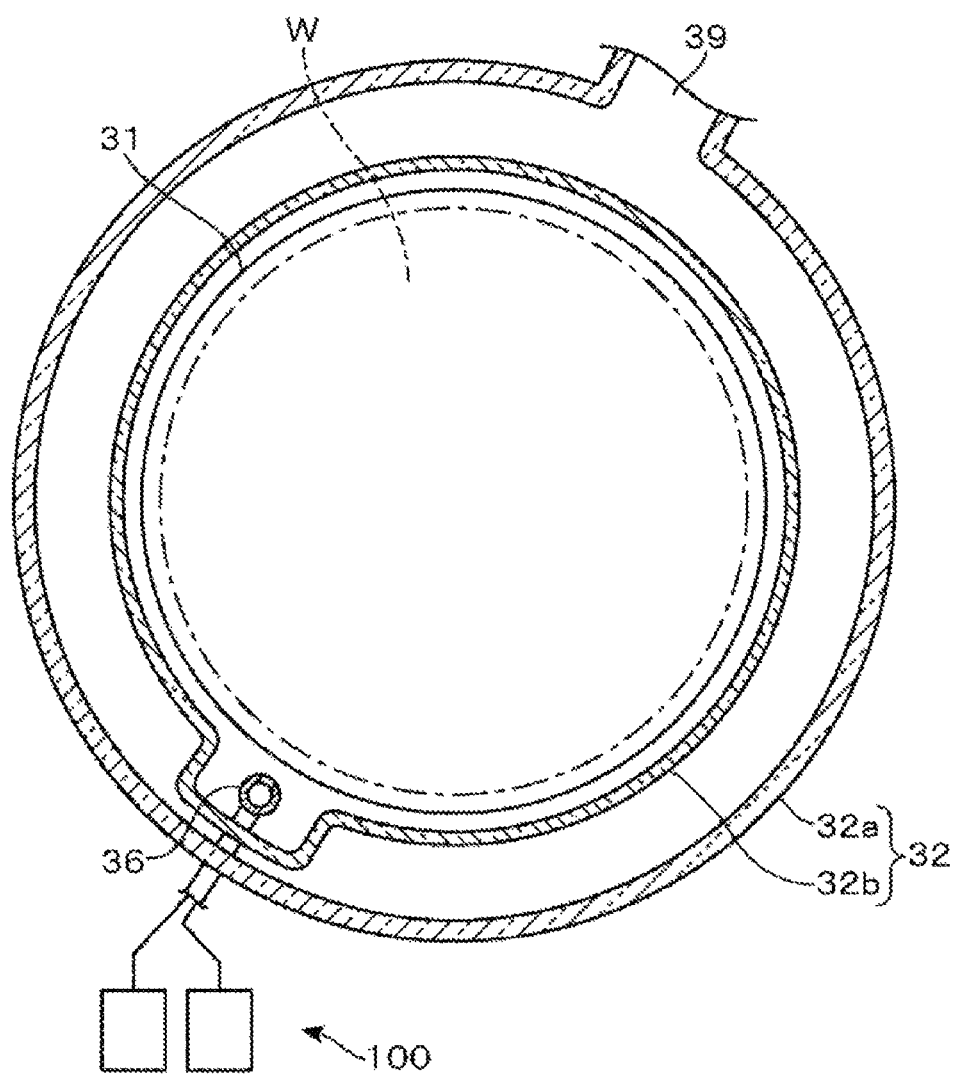
FIG. 16 is a transverse sectional plan view showing the other example of the apparatus for performing the film forming method.

In the aforementioned apparatus shown in FIGS. 3 and 4 and the apparatus of FIG. 15, as shown in FIG. 16, the inner wall of the inner tube 32b (the reaction tube 32) is expanded outward along the lengthwise direction at a portion where the gas injectors 36 (36a and 36b) are disposed, and then, the gas injectors 36 (36a and 36b) may be accommodated in the expanded portion. As such, the gas injectors 36 (36a and 36b) are housed in the inner tube 32b, so that the gas injectors 36 (36a and 36b) can be allowed to approach the wafer W. Also, since it is difficult to allow each processing gas to be removed from the gap region between the outer peripheral end of the wafer boat 31 and the inner tube 32b, the uniformity of the processing can be improved. FIG. 16 shows an example in which the inner tube 32b of FIGS. 3 and 4 is formed to expand outward.

Also, in each apparatus described above, the gas injector 36 is disposed along the lengthwise direction of the wafer boat 31 to supply the processing gas in a side flow method. However, the processing gas may be supplied into the reaction tube 32 from the lower end position of the reaction tube 32 and exhausted through the upper end side of the reaction tube 32.

Figure 17:
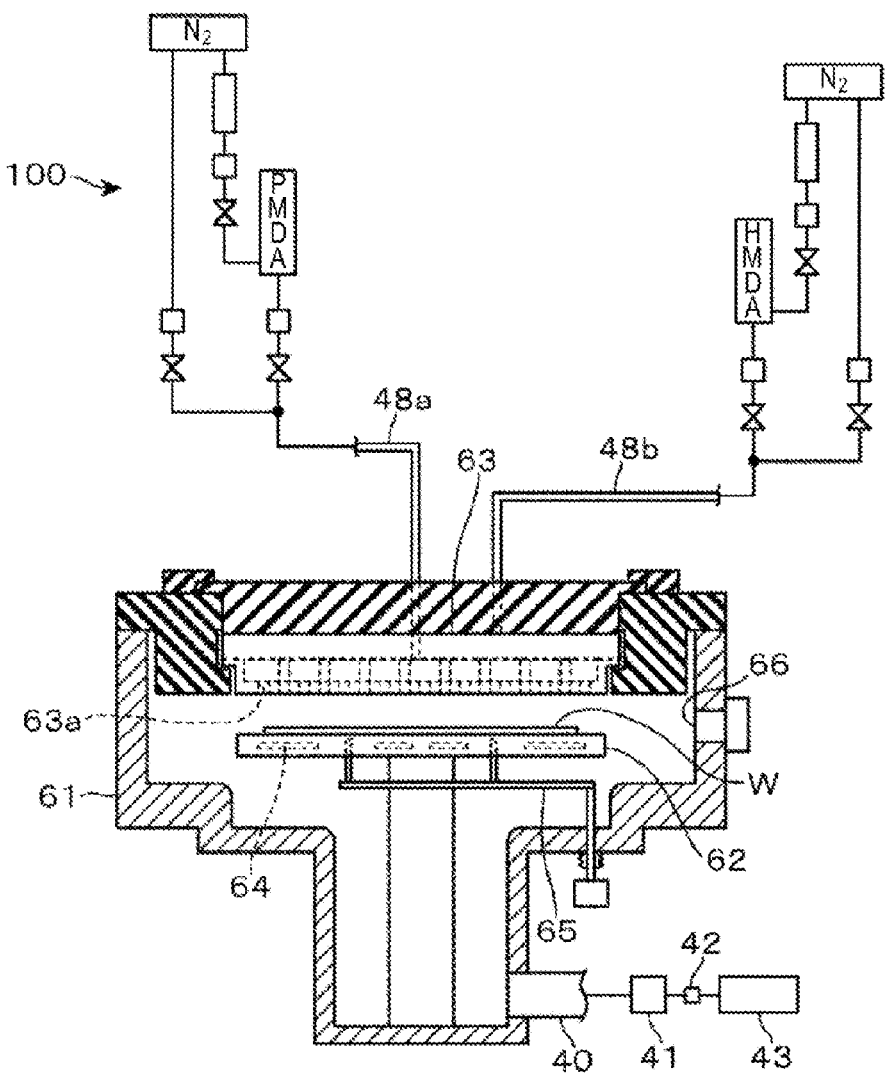
FIG. 17 is a longitudinal sectional view showing another example of the apparatus for performing the film forming method.

Moreover, FIG. 17 shows a single type apparatus for forming the polyimide film 1. The apparatus is provided with a processing chamber 61 and a susceptor 62 configured to pull and hold a wafer W in the processing chamber 61. A gas shower head 63 is disposed on the ceiling surface of the processing chamber 61 to face the susceptor 62, and gas supply pipes 48a and 48b for supplying first and second processing gases are connected to an upper side of the gas shower head 63, respectively. In addition, a gas flow path 63a is formed inside the gas shower head 63 so that the processing gases are injected into the processing chamber 61 without being mixed together.

In FIG. 17, reference numeral 64 designates a heater embedded in the susceptor 62 to heat the wafer W, and reference numeral 65 designates a lifting pin for lifting the wafer W on the susceptor 62 from below. Also, reference numeral 66 designates a wafer W loading port. In FIG. 17, the same reference numerals designate the same elements as those of the aforementioned apparatus, and redundant descriptions thereof will be omitted. The description on a static chuck installed to the susceptor 62 will also be omitted.

In this apparatus, the first and second processing gases are alternately supplied to the wafer W heated at the temperature at which the polyimide film 1 is formed, and, the atmosphere in the processing chamber 61 is replaced by a replacement gas when the processing gasses are switched.

Figure 18:
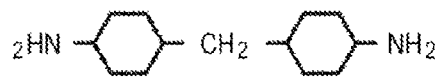
FIG. 18 is an explanatory view showing an example of a second monomer used in the film forming method.
Figure 18:
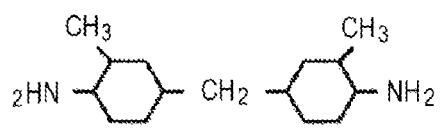
Figure 18:
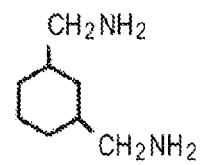
Figure 18:
Figure 18:
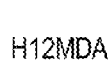

Instead of HMDA, compounds ($H_{12}$MDA, $H_{12}$MDAMe, $H_6$XDA and DAD) shown in FIG. 18 may also be used as the second monomer including the non-aromatic monomer described above. Any one of these compounds as the second monomer is formed with two amino groups, and a non-aromatic molecular is interposed between the amino groups, thereby providing excellent insulation properties. In this case, the alicyclic diamine ($H_{12}$MDA, $H_{12}$MDAMe, or $H_6$XDA) is used as a raw material of polyurethane and is a compound having high general purpose properties. Thus, like HMDA, the alicyclic diamine can restrain an increase in cost when the polyimide film 1 is formed.

Figure 19:
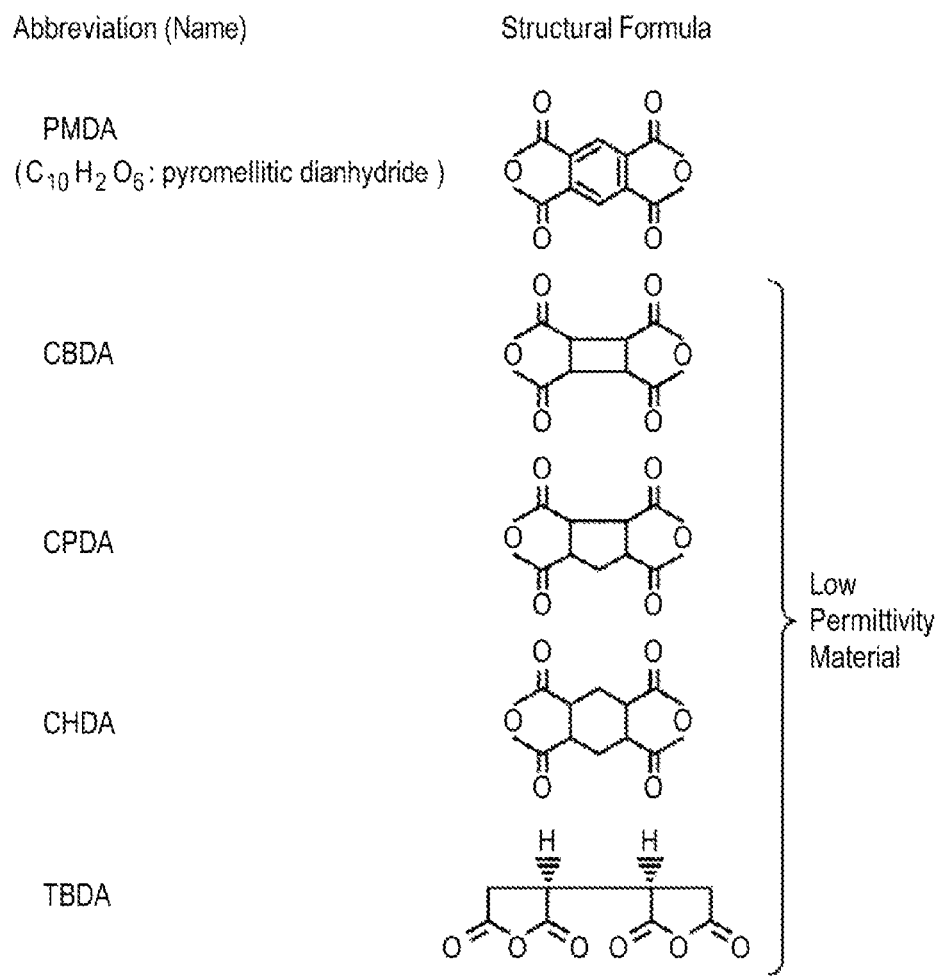
FIG. 19 is an explanatory view showing an example of a first monomer used in the film forming method.

Instead of PMDA described above, compounds shown in FIG. 19 may be used as the first monomer. In FIG. 19, the first monomer includes an aromatic monomer containing benzene (PMDA) and a non-aromatic monomer containing no benzene (CBDA, CPDA, CHDA or TBDA), any compound of which has the two aforementioned functional groups, each including the 5-membered ring. The non-aromatic monomer has a relative permittivity lower than that of the aromatic monomer (is superior in insulation properties to the aromatic monomer).

In the aforementioned examples, although an aromatic monomer is used as the first monomer and a non-aromatic monomer is used as the second monomer, non-aromatic and aromatic monomers may be used as the first and second monomers, respectively. Even in this case, the polyimide film 1 having excellent insulation properties is also obtained. In the case that a non-aromatic monomer is used as the first monomer, an aromatic monomer such as 4-4'-ODA, 3-4'-ODA, NDA or DDS may be used as the second monomer as shown in FIG. 20. However, in terms of the aforementioned electron donation (reaction rate), aromatic and non-aromatic monomers are preferably used as the first and second monomers, respectively. Also, in order for the polyimide film 1 to secure more satisfactory insulation properties, a non-aromatic monomer may be used as both the first and second monomers. In this case, satisfactory insulation properties are obtained, as compared with the case that an aromatic monomer is used as one or both of the first and second monomers.

If the time duration tp for which the replacement gas is supplied when the processing gases are switched is too short, it is apprehended that the replacement of atmosphere may be insufficiently performed, and if the time duration tp is too long, the throughput is decreased. Therefore, the time duration tp is preferably 2 seconds to 10 seconds. Also, if the time durations t1 and t2 for which the respective processing gases are supplied are too short, the processing (the thickness of the polyimide layer 1) may be non-uniform, and if the time durations t1 and t2 are too long, it is difficult to replace the atmosphere due to an excessive increase in the remaining amount of the processing gas. Thus, each of the time durations t1 and t2 is preferably 2 seconds to 5 seconds.

Figure 21:
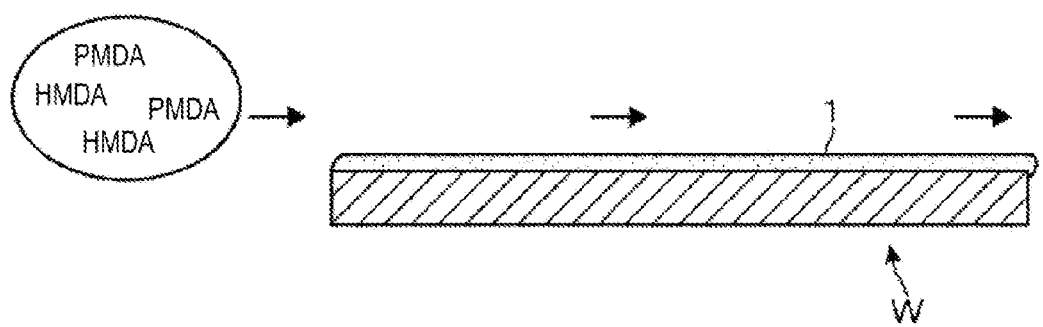
FIG. 21 is a longitudinal sectional view schematically illustrating another film forming method of the present disclosure.

Although the sequence polymerization method has been described in the above examples, the film forming processing may be performed using a mixture gas in which the first and second monomers are mixed together as shown in FIG. 21. When the mixture gas is used, for example, in the vertical type heat treatment apparatus of FIGS. 3 and 4, the respective monomers are simultaneously supplied from the respective gas supply pipes 48a and 48b to the lower portion of the gas injector 36, and the mixture gas is injected into the reaction tube 32 through the gas injector 36. Also, when the mixture gas is used, it is difficult to form the polyimide film 1 having a uniform thickness, thus the sequence polymerization method is used in the following examples.

EXAMPLES

Experimental Example 1

Figure 22:
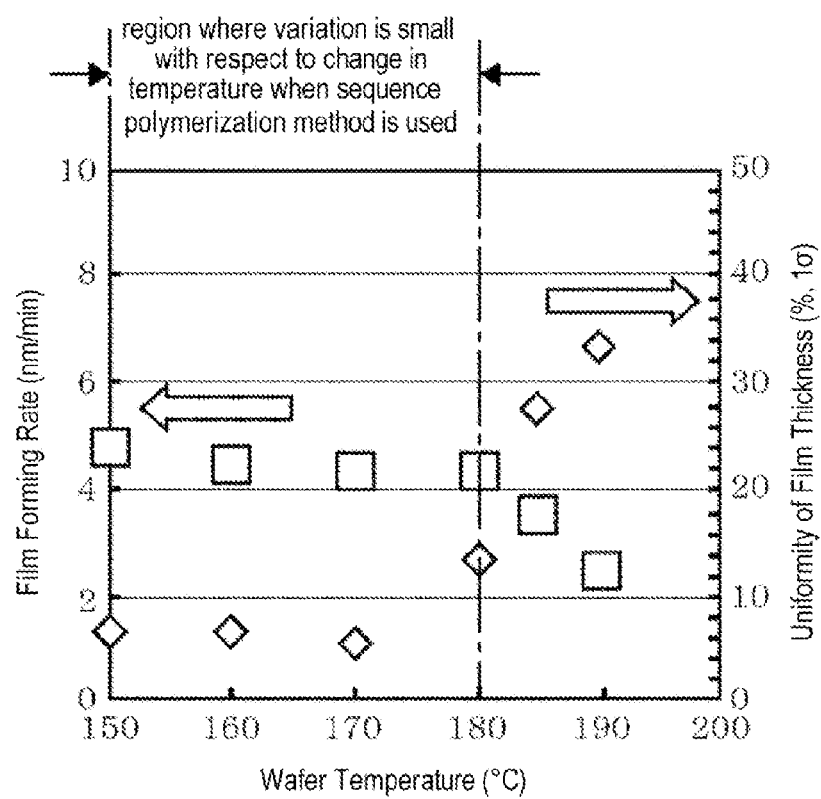
FIG. 22 is a view showing characteristics obtained in examples.
Figure 23:
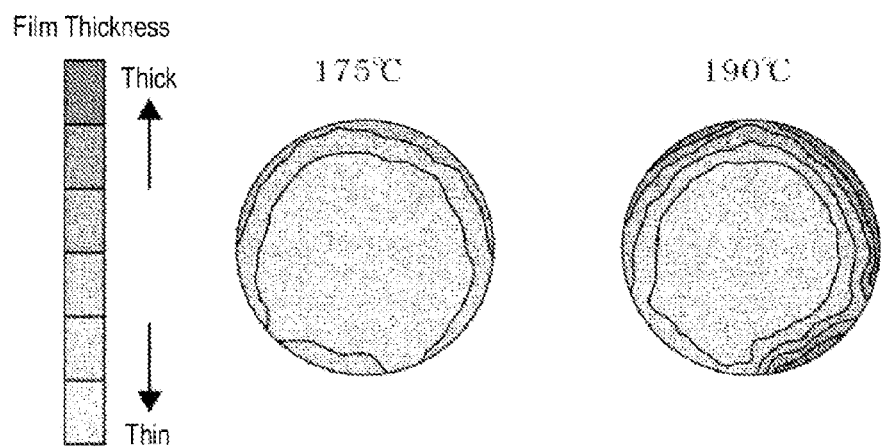
FIG. 23 is a view showing characteristics obtained in examples.

Subsequently, experiments performed on the present disclosure will be described. First, the correlation of film forming temperature (wafer temperature) with a film forming rate and uniformity of film thickness when the polyimide film 1 is formed by the sequence polymerization method will be described. In specific experiments, the film forming temperature was changed from 150 degrees C. to 200 degrees C. at a pitch of 10 degrees C., and simultaneously, the film forming rate and the uniformity of film thickness of the polyimide film 1 formed at each film forming temperature were measured. As a result, it could be seen that the polyimide film 1 can be formed by the sequence polymerization method in the temperature range from 150 degrees C. to 200 degrees C. as shown in FIG. 22. FIG. 23 shows thickness distributions of polyimide films 1 respectively obtained at 175 degrees C. and 190 degrees C.

In this case, it could be seen that the temperature dependence becomes flat for any one of the film forming rate and the uniformity of film thickness at 180 degrees C. or less, and the polyimide film 1 is satisfactorily formed even at a low temperature of 150 degrees C. Meanwhile, above 180 degrees C., both the film forming rate and the uniformity of film thickness were deteriorated. It is considered that such occurrence happens because if the film forming temperature exceeds 180 degrees C., the saturation of the film formation of the monomer adsorbed once on the wafer W is no longer maintained. Therefore, in the sequence polymerization method, the temperature at which the polyimide film 1 is satisfactorily obtained may be 150 degrees C. to 180 degrees C., and the temperature at which the polyimide film 1 can be formed may be 150 degrees C. to 200 degrees C.

Here, in a conventional method of forming a film through a solution (a method of applying monomers at room temperature and then elevating temperature up to a curing temperature necessary for imidization of the monomers), a high temperature of 300 degrees C. or more was required as the curing temperature. Also, even in a deposition polymerization method of mixing first and second monomers in a gaseous phase and supplying the mixture gas to a heated wafer W, the film forming temperature was still 200 degrees C. or more. Further, if the film forming temperature is set lower than 200 degrees C. in the deposition polymerization method, the formation ratio of polyimide (weight of polyimide produced ÷weight of polyimide input) is rapidly declined. For example, the formation ratio is declined to 40% or so at 160 degrees C. Meanwhile, since the film formation is possible at a low temperature of 200 degrees C. or less in the sequence polymerization method of the present disclosure, it can be seen that the polyimide film 1 can be applied as an insulation film in a process of stacking a plurality of wafers W using the temporary fixing material 14 which is exfoliated at a low temperature of 220 degrees C. or less as described above. In this case, although the film forming temperature is 150 degrees C. in the sequence polymerization method, the formation ratio is 90% or more. Further, the monomer corresponding to only one layer is saturated in the wafer W, so that molecules can be easily moved in the surface of the wafer W.

Experimental Example 2

Subsequently, a film forming processing was performed by variously changing the film forming temperature from 150 degrees C. to 170 degrees C. and respectively setting the time duration tp for which the replacement gas was supplied to 3 seconds, 6 seconds and 10 seconds for each film forming temperature, and then, film forming rate, coatability, stress, leakage current, chemical resistance and TDS (Thermal Desorption Spectroscopy) were measured. Each of the time durations t1 and t2 for supplying the respective processing gases was set to 2 seconds in each condition. The "coatability" represents a ratio obtained by dividing the thickness of the polyimide film 1 at the lower side of the concave portion 10 by the thickness of the polyimide film at the upper side of the concave portion 10. As such a ratio increases, it can be said that the film can be satisfactorily formed in the concave portion 10. Then, the amount of moisture contained in the polyimide film 1, after the film forming formation, was measured in the TDS. The "chemical resistance" represents a variation in film thickness (((film thickness after film formation−film thickness after exposure to chemicals)÷(film thickness after film formation))×100(%)) between before and after the wafer W is exposed to a plurality of chemicals after the polyimide film 1 is formed. That is, while the precursor is dissolved by the chemicals, the polyimide film 1 is not dissolved (or hardly dissolved) by the chemicals. Thus, a proceeding degree of imidization and a resistance against chemicals can be seen by evaluating the variation in the film thickness.

Figure 24:
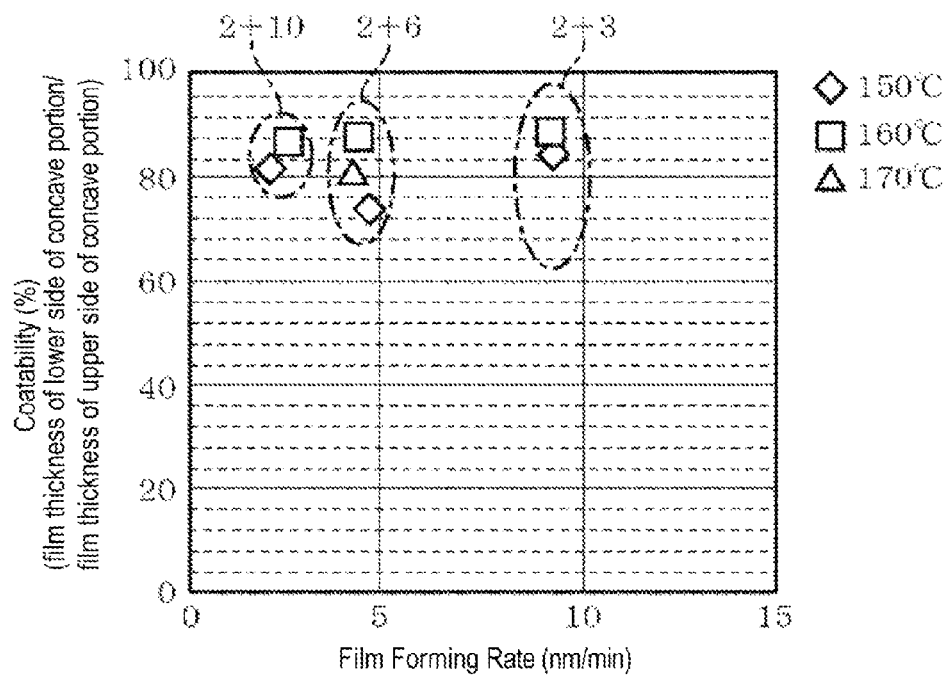
FIG. 24 is a view showing characteristics obtained in examples.

First, referring to FIG. 24 showing the correlation between film forming rate and coatability, as described above, an extremely high coatability of 70% or more was obtained under any condition. The correlation between the film forming rate or film forming temperature and the coatability was not specially shown. That is, even though the time duration tp for supplying the replacement gas was shortened (3 seconds) or lengthened (10 seconds) or the film forming temperature was changed in a range from 150 degrees C. to 170 degrees C., the influence thereof on the coatability was not verified. Also, in FIG. 24, the results obtained under the conditions of the same time duration tp are surrounded by a dash-and-dot line, and "time duration t1 (t2)+time duration tp" is indicated therewith.

Figure 25:
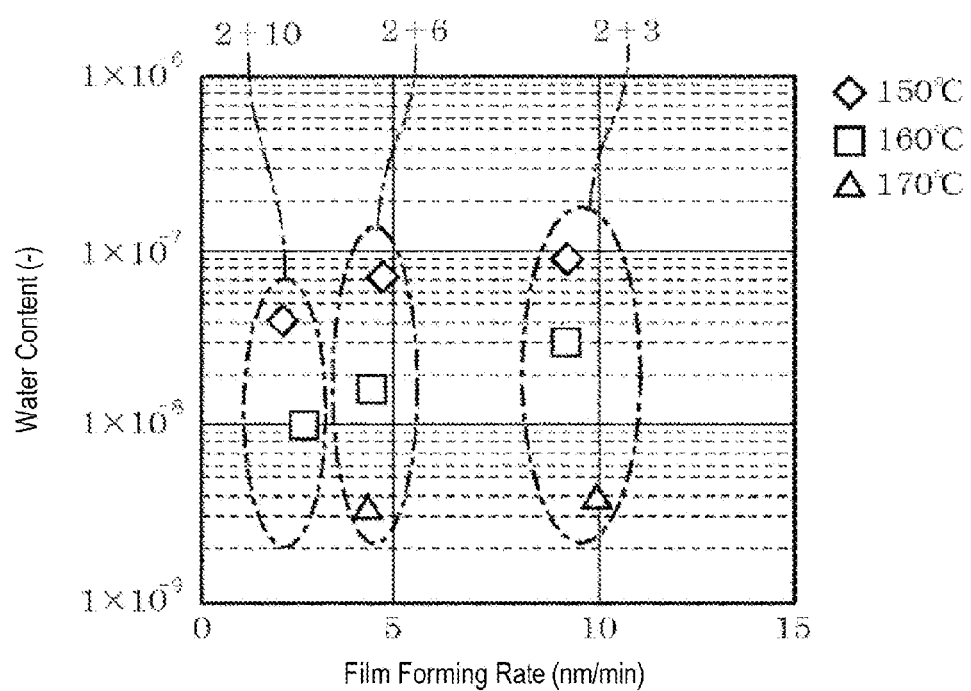
FIG. 25 is a view showing characteristics obtained in examples.

Next, referring to FIG. 25 showing the correlation between film forming rate and results of TDS (water content and purity of the polyimide film 1), the amount of water (the amount of precursor or monomers before dehydration condensation) contained in the polyimide film 1 was extremely small when the film forming temperature was 160 degrees C. or more and the time duration tp was set to 10 seconds at 150 degrees C., and the results thereof became satisfactory as the film forming temperature increased. Thus, it could be seen that as the film forming temperature increased in this temperature range, the polymerization of the polyimide film 1 was easily performed. As the time duration tp for supplying the replacement gas increased, the water content was slightly improved. This is because, as described in FIG. 26 below, not only the replacement of atmosphere is simply performed when the replacement gas is supplied, but also the polyimide film 1 is formed from precursor when the precursor still remains on the wafer W.

Figure 26:
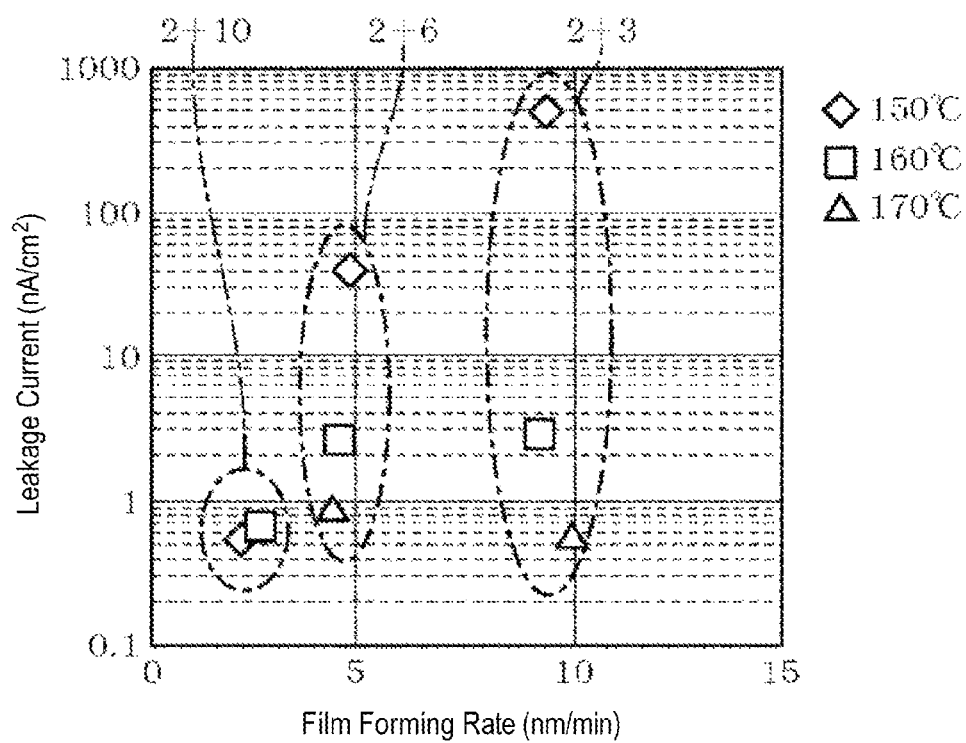
FIG. 26 is a view showing characteristics obtained in examples.

Subsequently, the correlation between the film forming rate and the leakage current will be described with reference to FIG. 26. First, when the supply time duration tp was 3 seconds, the leakage current became satisfactory as the film forming temperature increased. When the supply time duration tp was 6 seconds, the leakage current had the same result as when the supply time duration tp was 3 seconds at the film forming temperature of 170 degrees C. However, at the film forming temperature of 150 degrees C. or 160 degrees C., the leakage current had a result more satisfactory than that when the supply time duration tp was 3 seconds. Therefore, it is considered that when the film forming temperature is 170 degrees C., the formation of the polyimide film 1 has been completed even though the supply time duration tp is 3 seconds. Meanwhile, it is considered that when the film forming temperature is 150 degrees C. or 160 degrees C., the formation of the polyimide film 1 is not completed at the supply time duration tp of 3 seconds, and the precursor remains. Also, the result when the film forming temperature was 150 degrees C. or 160 degrees C. was further improved when the supply time duration tp was lengthened up to 10 seconds, and had about the same result as that (the supply time duration tp: 3 seconds, 6 seconds) when the film forming temperature was 170 degrees C.

From the results described above, when the film forming temperature is 170 degrees C., the reaction from the precursor to the reactive layer 3 is rapidly performed during the supply of the second monomer or during the replacement of the atmosphere thereafter. Thus, even though the supply time duration tp is short, the moisture hardly remains in the polyimide film 1. Meanwhile, if the film forming temperature is decreased, it is difficult to end the reaction only for the time duration t2 for which the second monomer is supplied and the supply time duration tp for which the atmosphere is replaced. In other words, when the film forming temperature is 170 degrees C., the time required to complete the formation of the reactive layer 3 (hereinafter, referred to as "reaction time duration") is shorter than 5 seconds (2 seconds (time duration t2) +3 seconds (supply time duration tp)). Thus, when the film forming temperature is 170 degrees C., the leakage current of the polyimide film 1 is hardly influenced even though the supply time duration tp is short such as 3 seconds. However, as the film forming temperature is decreased, the reaction time duration becomes longer than 5 seconds. Therefore, in order to obtain a satisfactory (low) leakage current value, it is preferred that the time duration tp for supplying the replacement gas be lengthened by the value obtained by lengthening the reaction time duration.

Referring to Table 1 summarizing the results described above, since the stress remaining in the polyimide film could be released, a satisfactory value was obtained under any condition. In the chemical resistance test, a change in film thickness was satisfactory at the film forming temperature of 160 degrees C. or more. In addition, when the film forming temperature was 150 degrees C., the change in film thickness had a value greater than the result at the temperature of 160 degrees C. However, as the time duration tp was lengthened, the change in film thickness became satisfactory.

Experimental Example 3

In Experimental Example 3, the uniformity of the thickness of the polyimide film 1 was evaluated when the supply time duration tp was set to 1 second, 3 second, 6 seconds and 10 seconds. In this case, the film forming processing was performed under the following experimental conditions. Similarly, the case that film forming processing was performed using a mixture gas of monomers was evaluated as a comparative example.

(Film Forming Conditions)
Monomer: PMDA, HMDA
Supply amount of each processing gas: 10 sccm
Supply amount of purge gas: 100 sccm
Heating temperature of wafer W: 150 degrees C.
Processing pressure: 26.67 Pa (0.2 torr)
Time duration t1, t2: 2 seconds for each
Gas supply method: Side flow method
Number of cycles: 100

Figure 27:
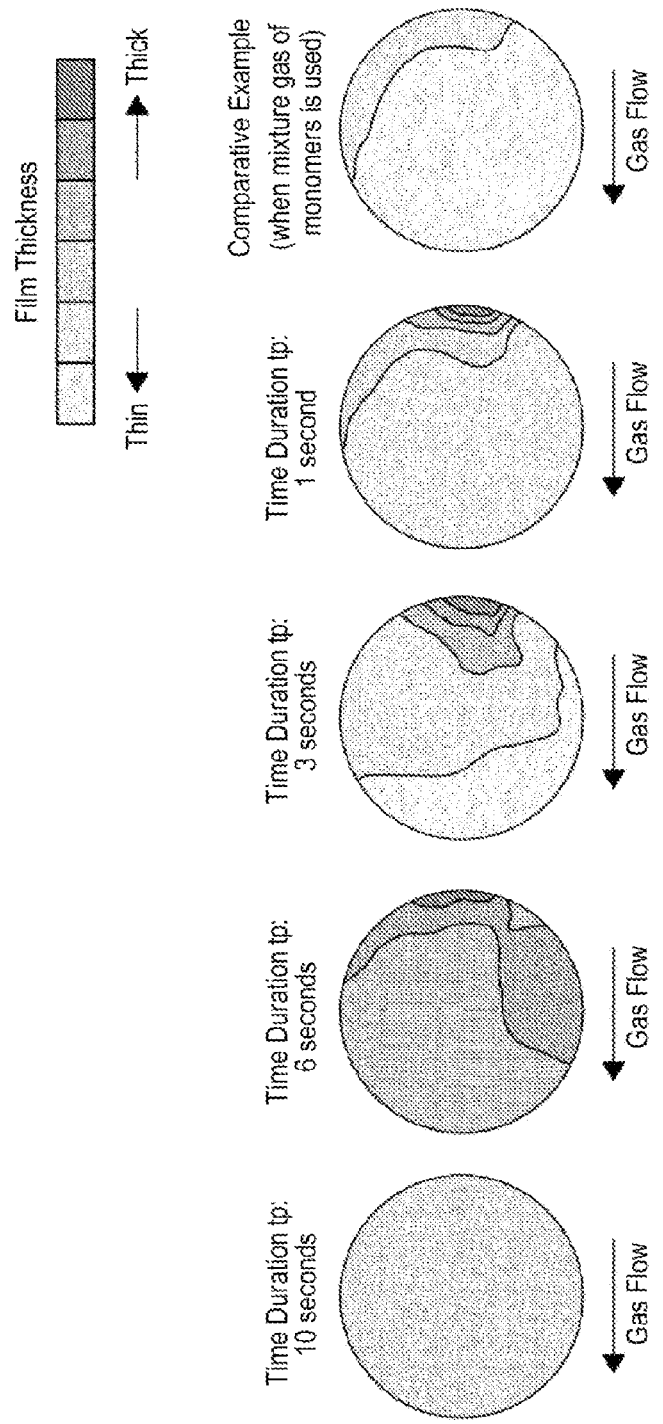
FIG. 27 is a view showing characteristics obtained in examples.

As a result, as shown in FIG. 27 and Table 2, in the comparative example, the gas was rapidly consumed at the upstream side (right side) of the gas flow and therefore a thick film of 300 nm or more in thickness was formed. On the other hand, whereas the monomer is hardly supplied at the downstream side (left side) of the gas flow and therefore an extremely thin film of 2 nm in thickness was formed.

TABLE 2

| Supply Time Duration tp (sec) | | 10 | 6 | 3 | 1 | Comparative Example |
|---|---|---|---|---|---|---|
| Film Thickness | Average (nm) | 121 | 181 | 348 | 265 | 44 |
| | Maximum (nm) | 144 | 238 | 671 | 655 | 311 |
| | Minimum (nm) | 114 | 155 | 195 | 143 | 2 |
| | Uniformity (1σ, %) | 5.9 | 9.5 | 29.5 | 41.6 | 166.2 |
| Film Forming Rate | (nm/min) | 3 | 6.8 | 20.9 | 26.5 | 8.9 |
| | (nm/cycle) | 1.2 | 1.8 | 3.5 | 2.6 | 44.3 |

On the other hand, in the sequence polymerization method of the present disclosure, it could be seen that the polyimide film 1 having high uniformity of film thickness is formed under any conditions. As the supply time duration tp was lengthened, i.e., as the amount of the processing gas contained in the atmosphere was decreased, the uniformity of film thickness was improved. Also, in FIG. 27, the region where the film thickness is small is enlarged relative to the other result regions (by narrowing a range of the film thick-

TABLE 1

| Film Forming Temp. (degrees C.) | Time Durations t1, t2 (sec) | Time Duration tp (sec) | Film Forming Rate (nm/min) | Coatability (film thickness of lower side of concave/film thickness of upper side of concave) % | Stress (Pa) | Leakage Current (nA/cm$^2$(at 1 MV/cm)) | Change in Film Thickness of Chemical Resistance Test (%) | H$_2$O Peak in TDS (peak strength at 200 degrees C.) |
|---|---|---|---|---|---|---|---|---|
| 180 | 2 | 6 | 4.8 | 84 | 54 | 0.82 | | 2.0 × 10$^{-9}$ |
| 170 | 2 | 3 | 10 | 60 | 22 | 0.6 | <1 | 4.0 × 10$^{-9}$ |
| | 2 | 6 | 4.3 | 81 | 46 | 0.87 | <1 | 3.6 × 10$^{-9}$ |
| | 2 | 10 | 2.4 | | | | | |
| 160 | 2 | 3 | 9.2 | 86 | | 2.83 | >1 | 3.0 × 10$^{-8}$ |
| | 2 | 6 | 4.4 | 87 | | 2.53 | <1 | 1.6 × 10$^{-8}$ |
| | 2 | 10 | 2.3 | 86 | 27 | 0.62 | <1 | 1.0 × 10$^{-8}$ |
| 150 | 2 | 3 | 9.3 | 84 | | 499 | >20 | 9.0 × 10$^{-8}$ |
| | 2 | 6 | 4.7 | 73 | 20 | 37 | >10 | 7.0 × 10$^{-8}$ |
| | 2 | 10 | 2.2 | 81 | 22 | 0.52 | >3 | 4.0 × 10$^{-8}$ | ness) since the uniformity of film thickness is extremely high when the supply time duration tp is 6 seconds and 10 seconds.

Experimental Example 4

Figure 28:
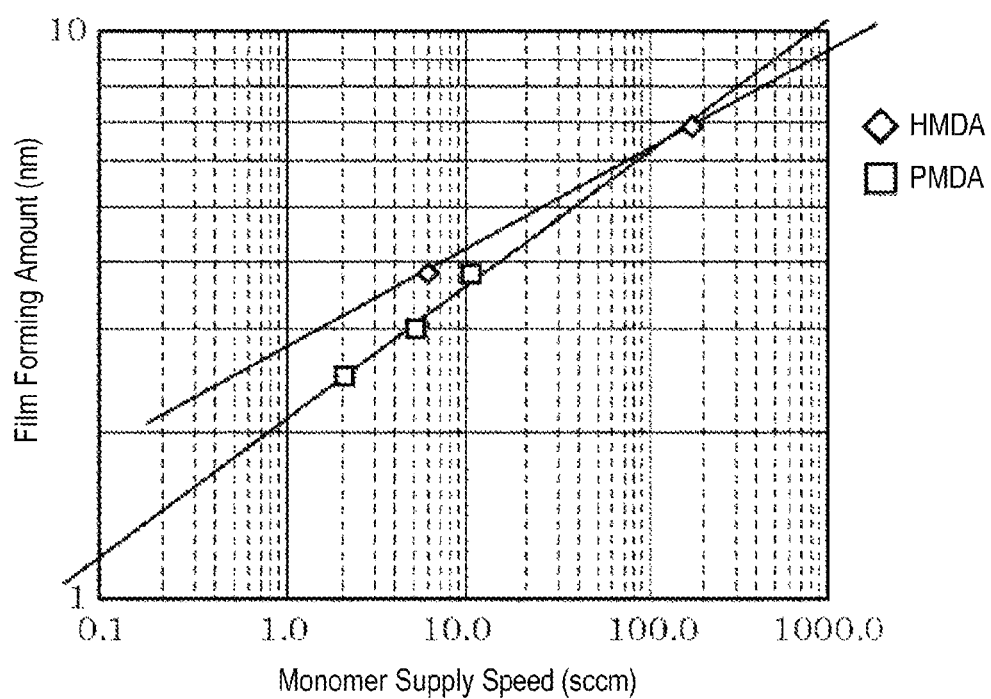
FIG. 28 is a view showing characteristics obtained in examples.

Subsequently, the correlation between supply amount (supply rate) of each monomer and the film forming rate calculated based on the film forming amount (film thickness) shown in FIG. 28 was verified. As shown in Tables 3 and 4, it could be seen that the film forming rate has the almost same value regardless of the supply amount of each monomer. Specifically, when the supply amount of each monomer was increased from 10 sccm to 15 sccm, the increase rate of the supply amount was 150%, but the increase rate of the film forming rate stayed at 7.1% or 11%. Thus, in the sequence polymerization method, since the adsorption of the first monomer onto the surface of the wafer W is saturated, the thickness of the adsorption layer 2 is almost constant in each cycle. Also, it can be seen that since the reactive layer 3 is formed up to the thickness of the adsorption layer 2, the thickness of the reactive layer 3 is almost constant in each cycle. In other words, it can be seen that the supply amount of the monomer need not be controlled so high in the sequence polymerization method. In the sequence polymerization method of the present disclosure, the change in the film forming rate with respect to the supply amount of gas becomes about $\frac{1}{10}$ as compared with when the film forming processing is performed using the mixture gas of the monomers. Also, when the supply amount of one of the two monomers is changed, the supply amount of the other monomer is fixed to a certain value.

TABLE 3

| Supply Amount of HMDA (sccm) | Film Forming Rate (nm/min) |
|---|---|
| 10 | 4.2 |
| 15 | 4.5 |
| Δ% = 150% | Δ% = 7.1 |

TABLE 4

| Supply Amount of PMDA (sccm) | Film Forming Rate (nm/min) |
|---|---|
| 10 | 3.7 |
| 15 | 4.1 |
| Δ% = 150% | Δ% = 11 |

Experimental Example 5

Figure 29:
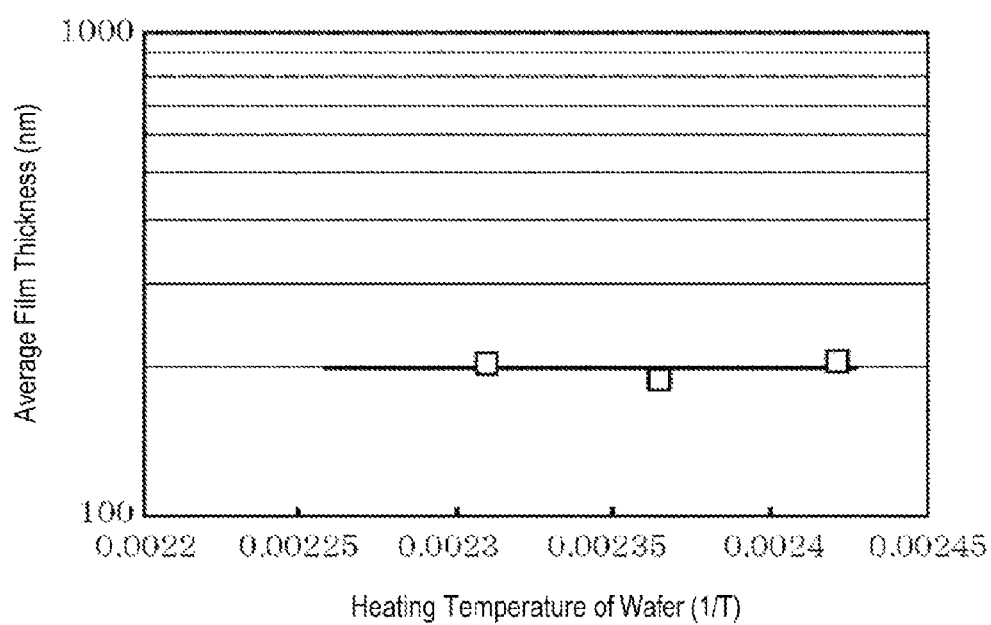
FIG. 29 is a view showing characteristics obtained in examples.
Figure 30:
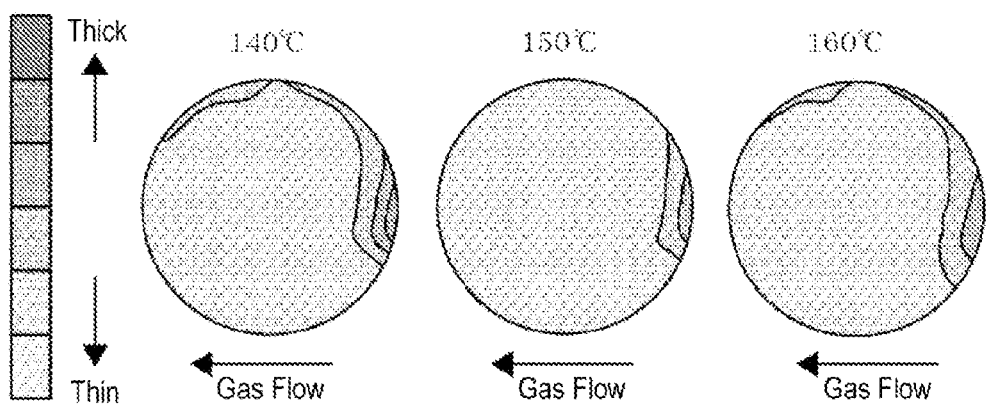
FIG. 30 is a view showing characteristics obtained in examples.

In the sequence polymerization method of the present disclosure, it was verified that the heating temperature (the film forming temperature) of the wafer W had influence on the thickness of the polyimide film 1. The heating temperature of the wafer W was set to 140 degrees C., 150 degrees C. and 160 degrees C., and simultaneously, the other film forming conditions were set as follows.
(Film Forming Conditions)
Monomer: PMDA, HMDA
Supply amount of each processing gas: 10 sccm
Supply amount of nitrogen gas (carrier gas and replacement gas): 100 sccm
Time duration t1, t2: 2 seconds for each
Supply time duration tp: 3 seconds
Gas supply method: Side flow method As a result, as shown in FIG. 29, the average thickness of the polyimide film 1 was almost constant regardless of the heating temperature of the wafer W. The distributions of film thickness and measurement results obtained from the experiment are shown in FIG. 30 and Table 5, respectively. In FIG. 29, the horizontal axis represents a reciprocal number of temperature T.

TABLE 5

| | | Film Forming Temperature (degrees C.) | | |
|---|---|---|---|---|
| | | 140 | 150 | 160 |
| Film Thickness | Average (nm) | 207 | 187 | 203 |
| | Maximum (nm) | 363 | 324 | 330 |
| | Minimum (nm) | 148 | 136 | 154 |
| | Uniformity (1σ, %) | 20.2 | 19.7 | 18.4 |
| Film Forming Rate | (nm/min) | 12.4 | 11.2 | 12.2 |
| | (nm/cycle) | 2.1 | 1.9 | 2 |

Also, when comparing the present disclosure with the comparative example, a degree of change in film thickness was evaluated with respect to a variation in the heating temperature of the wafer W. Specifically, since the polyimide film was formed by causing the kinds of monomers or processing conditions to correspond to each other, as shown in Table 6, in the present disclosure, the variation in film thickness was extremely small with respect to the variation in the heating temperature of the wafer W. Meanwhile, in the comparative example using a mixture gas (premix), the variation in film thickness was increased with respect to the variation in the heating temperature of the wafer W. Thus, in the sequence polymerization method of the present disclosure, the polyimide film 1 having high uniformity can be formed without strictly controlling the heating temperature of the wafer W, as compared with the comparative example. Accordingly, for example, the configuration of the apparatus can be simplified.

TABLE 6

| Film Forming Method | Second Monomer | Result |
|---|---|---|
| Premix | HMDA | X |
| Sequence Polymerization Method | HMDA | ○ |

According to the present disclosure, a polyimide film is formed by supplying a first monomer including a bifunctional anhydride and a second monomer including a bifunctional amine to a substrate heated at the temperature necessary for imidization. In this process, a non-aromatic monomer is used as at least one of the monomers. Thus, even though an aromatic monomer containing a benzene ring with rich electrons is used as the first monomer, insulative non-aromatic compounds derived from the non-aromatic monomer are arranged at both sides of the benzene ring (aromatic monomer) to interpose the benzene ring between the non-aromatic compounds in the molecular chain constituting the polyimide film 1. Accordingly, since an electron can be restrained from moving through the non-aromatic compound between adjacent benzene rings, the polyimide film having low relative permittivity can be formed, as compared with the polyimide film synthesized using aromatic monomers as both of the first and second monomers. Also, when non-aromatic monomers are used as both of the first and second monomers, the relative permittivity is naturally lowered, as compared with the case that an aromatic monomer is used as one or both of the first and second monomers. Accordingly, the polyimide film is formed using a non-aromatic monomer as at least one of the first and second monomers, whereby the polyimide film can be applied as an insulation film. Further, it is unnecessary to elevate the temperature of the substrate up to a temperature considerably higher than the deposition temperature during the process, as compared with a conventional method of vacuum depositing monomers on a substrate and then increasing the temperature of the substrate up to a temperature necessary for imidizing the monomers. Accordingly, it is possible to apply the polyimide film even to a device that cannot endure a high temperature, to rapidly perform the film forming processing, and to perform satisfactory burial into a concave portion of the substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a polyimide film on a surface of a substrate by dehydration condensation of a first monomer including a bifunctional acid anhydride and a second monomer including a bifunctional amine, the method comprising:
    loading the substrate into a processing chamber;
    heating the substrate at a temperature for forming a polyimide film;
    supplying the substrate with a first processing gas containing the first monomer and a second processing gas containing the second monomer; and
    evacuating at least one of the first processing gas and the second processing gas from the processing chamber,
    wherein the first and second monomers are aromatic and non-aromatic monomers, respectively,
    wherein supplying the substrate with the processing gases comprises performing a cycle a predetermined number of times, the cycle including supplying a first processing gas containing the first monomer to the substrate, supplying a second processing gas containing the second monomer to the substrate, and supplying a replacement gas in the processing chamber between supplying the first processing gas and supplying the second processing gas thereby replacing atmosphere in the processing chamber by the replacement gas, and
    wherein a film forming rate is at least 1.2 nm/cycle, and
    wherein the second monomer as a non-aromatic monomer is HMDA.

2. The method of claim 1, wherein heating the substrate includes heating the substrate to a temperature ranging from 100 degrees C. to 250 degrees C.

3. The method of claim 1, wherein a concave portion is formed in the surface to be processed of the substrate, and the polyimide film is buried in the concave portion.

4. The method of claim 1, wherein gas pressure in the processing chamber when the polyimide film is formed on the substrate is 13 Pa to 267 Pa.

* * * * *